(12) United States Patent
Jain et al.

(10) Patent No.: US 6,848,090 B2
(45) Date of Patent: Jan. 25, 2005

(54) MECHANISM FOR RECOGNIZING AND ABSTRACTING PRE-CHARGED LATCHES AND FLIP-FLOPS

(75) Inventors: Alok Jain, New Delhi (IN); Manpreet Reehal, SAS Nagar Mohali (IN)

(73) Assignee: Cadence Design Systems, Inc., San Jose, CA (US)

( * ) Notice: Subject to any disclaimer, the term of this patent is extended or adjusted under 35 U.S.C. 154(b) by 512 days.

(21) Appl. No.: 10/014,176

(22) Filed: Dec. 11, 2001

(65) Prior Publication Data

US 2003/0110458 A1 Jun. 12, 2003

(51) Int. Cl.$^7$ ............................ G06F 9/45; G06F 17/50

(52) U.S. Cl. ........................ 716/6; 716/2; 716/3; 716/4

(58) Field of Search ................. 716/1–4, 6; 703/13–15, 703/19

(56) References Cited

U.S. PATENT DOCUMENTS

| | | | | | |
|---|---|---|---|---|---|
| 5,657,239 | A | * | 8/1997 | Grodstein et al. | 716/6 |
| 6,083,273 | A | * | 7/2000 | Takeuchi | 716/6 |
| 6,442,739 | B1 | * | 8/2002 | Palermo et al. | 716/6 |
| 6,539,345 | B1 | * | 3/2003 | Jones et al. | 703/15 |
| 6,643,829 | B1 | * | 11/2003 | Borkovic et al. | 716/3 |

OTHER PUBLICATIONS

D. T. Blaauw, et al., "Functional Abstraction of Logic Gates for Switch–Level Simulation," European Conference on Design Automation, pp. 329–333, Feb. 1991.

S. Kundu, "GateMaker: A Transistor to Gate Level Model Extractor for Simulation, Automatic Test Pattern Generation and Verification," International Test Conference, pp. 372–381, 1998.

R. E. Bryant, "Algorithmic Aspects of Symbolic Switch Network Analysis," IEEE Transactions on Computer Aided Design, pp. 618–633, Jul. 1987.

R. E. Bryant, "Boolean Analysis of MOS Circuits," IEEE Transactions on Computer Aided Design, pp. 634–649, Jul. 1987.

R. E. Bryant, "Extraction of Gate Level Models From Transistor Circuits by Four–Valued Symbolic Analysis," International Conference on Computer Aided Design, pp. 350–353, 1991.

S. Jain, et al., "Automatic Clock Abstraction from Sequential Circuits," Design Automation Conference, pp. 707–711, 1995.

(List continued on next page.)

Primary Examiner—Leigh M. Garbowski
(74) Attorney, Agent, or Firm—Bobby K. Truong; Hickman Palermo Truong & Becker LLP

(57) ABSTRACT

An abstraction mechanism is disclosed, which is capable of recognizing and abstracting precharged latches and flip-flops, and which is capable of generating a cycle ready representation of the precharged latches and flip-flops. In one embodiment, the abstraction mechanism abstracts precharged latches and flip-flops by using cofactors. In doing so, the abstraction mechanism accesses a logic level representation of a structure. Based upon the logic level representation, the abstraction mechanism derives one or more cofactors. These cofactors are then tested to determine whether they indicate precharge behavior, and whether they indicate latch or flip-flop behavior. If the cofactors indicate both precharge behavior and latch or flip-flop behavior, then the abstraction mechanism abstracts the structure as a precharged latch, or a precharged flip-flop, whichever is appropriate. By recognizing and abstracting precharged latches and flip-flops in this manner, the abstraction mechanism simplifies the functional representation of the structure, and makes it possible to generate a cycle ready representation of the structure.

60 Claims, 16 Drawing Sheets

OTHER PUBLICATIONS

R. Razden, et al., "Clock Suppression Techniques for Synchronous Circuits," IEEE Transactions on Computer Aided Design of Integrated Circuits and Systems, pp. 1547–1556, Oct. 1993.

F. Rocheteau, et al., "Tralala: A Fast and Accurate Functional Abstraction Tool For Transistor Netlists," SAME 99, Accessible from http://www.sansistor.com.

"Statement of Product Sale," 8 pages, Dec. 1999.

* cited by examiner

MECHANISM FOR RECOGNIZING AND ABSTRACTING PRE-CHARGED LATCHES AND FLIP-FLOPS

FIELD OF THE INVENTION

This invention relates generally to circuit analysis and more particularly to a mechanism for recognizing and abstracting pre-charged latches and flip-flops.

BACKGROUND

In the field of electronic component design, engineers use simulation tools on a regular basis to test their designs. With such tools, engineers are able to detect and correct errors, and enhance the functionality of their designs without actually building a physical component. This leads to great savings in manufacturing and design costs. Over the years, a number of techniques and tools have been developed to aid in the simulation process.

Currently, simulation tools can simulate and test the behavior of a component design on several different levels. One level at which designs can be simulated is the transistor level. To test a design at this level, an engineer typically specifies a design using a transistor level description language, such as SPICE or SPECTRE. The design is then run through a transistor level simulation tool. Based upon the results of the simulation, the engineer can determine whether the design operated properly. While simulating a design at the transistor level is effective, it is often not the most efficient way to test a design. This is because transistor level simulation is relatively slow and quite resource intensive, and because designers often are not interested in the operation of a design at that low a level. As a result, it is often preferable to simulate the operation of a design at a higher logic level rather than at the transistor level.

To test a design at the logic level, a logic level representation of the design is needed. A logic level representation may be derived by submitting the transistor level description of the design to an abstraction mechanism, and having the abstraction mechanism generate an equivalent logic level description. The logic level description may be in a higher level description language such as Verilog HDL. In generating the logic level description, the abstraction mechanism analyzes various combinations of transistors and circuit elements in the transistor level description of the design, and transforms the combinations into elements that perform logic functions (e.g. AND, OR, etc.). By abstracting the functions performed by various transistors and circuit elements, the abstraction mechanism generates a higher level representation of the design, which is simpler and more efficient to simulate. Once derived, the logic level representation may be submitted to an event level simulator for simulation.

Currently, three basic approaches are used to perform functional abstraction on a transistor level representation. These include pattern matching, transformation rules, and symbolic analysis. With pattern matching, a user specifies to the abstraction mechanism a set of transistor level patterns. The abstraction mechanism then performs the abstraction by looking for all instances of those patterns in the transistor level representation. With transformation rules, the user specifies a set of rules for transforming or replacing portions of a transistor level representation with certain logic gates. Using these rules, the abstraction mechanism makes the specified transformations throughout the transistor level representation. A major issue with these approaches is that they both require the user to provide a complete set of patterns or transformation rules. As a result, their application is somewhat limited to abstraction of structured designs in which only a limited set of transistor level configurations are used.

The third approach, symbolic analysis, is an algorithmic technique that abstracts functionality based upon transistor sizes and connectivity. Given a transistor level representation, symbolic analysis generates a functionally equivalent logic level representation using logic primitives and explicit delays (previous state is modeled with an explicit delay). An advantage of symbolic analysis is that it does not require users to specify patterns or transformation rules. Thus, it performs abstraction "automatically". A disadvantage of symbolic analysis is that it outputs a logic level representation that can only be submitted to an event level simulator for simulation. The output of symbolic analysis cannot be submitted to a cycle simulator, or an equivalence checker because it is not a cycle ready model. Symbolic analysis is described in detail in R. E. Bryant, "Extraction of Gate Level Models from Transistor Circuits by Four-Valued Symbolic Analysis," International Conference on Computer Aided Design, 1991, pages 350–353, and in R. E. Bryant, "Boolean Analysis of MOS circuits," IEEE Transactions on Computer Aided Design, Jul. 1987, pages 634–649. Both of these references are incorporated herein in their entirety by reference.

Overall, the abstraction techniques currently used are relatively rudimentary. They provide some capability for functionally abstracting simple elements, but they do not enable more complex structures, such as precharged latches and flip-flops to be abstracted (at least not to the latch or flip flop level). Because such structures are quite prevalent in modern component design, such an abstraction capability is needed.

SUMMARY

In view of the limitations of the prior art, there is provided an abstraction mechanism, which is capable of recognizing and abstracting precharged latches and flip-flops, and which is capable of generating a cycle ready representation of the precharged latches and flip-flops. Because the representation is cycle ready, it can be submitted to a cycle simulator, an equivalence checker, or an emulator for further simulation and emulation.

According to one embodiment, the abstraction mechanism abstracts precharged latches and flip-flops by using cofactors. In doing so, the abstraction mechanism accesses a logic level representation of a structure. Based upon the logic level representation, the abstraction mechanism derives one or more cofactors. These cofactors are then tested to determine whether they indicate precharge behavior, and whether they indicate latch or flip-flop behavior. If the cofactors indicate both precharge behavior and latch or flip-flop behavior, then the abstraction mechanism abstracts the structure as a precharged latch, or a precharged flip-flop, whichever is appropriate. By recognizing and abstracting precharged latches and flip-flops in this manner, the abstraction mechanism simplifies the functional representation of the structure, and makes it possible to generate a cycle ready representation.

DETAILED DESCRIPTION OF THE EMBODIMENT(S)

Techniques are disclosed below for recognizing and abstracting precharged latches and flip-flops. The techniques are implemented by an abstraction mechanism. In one embodiment, the abstraction mechanism takes the form of a set of computer program instructions executed by one or more processors. In an alternative embodiment, the abstraction mechanism may take the form of customized circuitry. These and other embodiments are within the scope of the present invention.

Before describing the techniques for recognizing and abstracting precharged latches and flip-flops in detail, some background information will be provided to facilitate a complete understanding of the invention. This background information will be provided with reference to a sample circuit design.

Preparation for Abstraction

Figure 1:
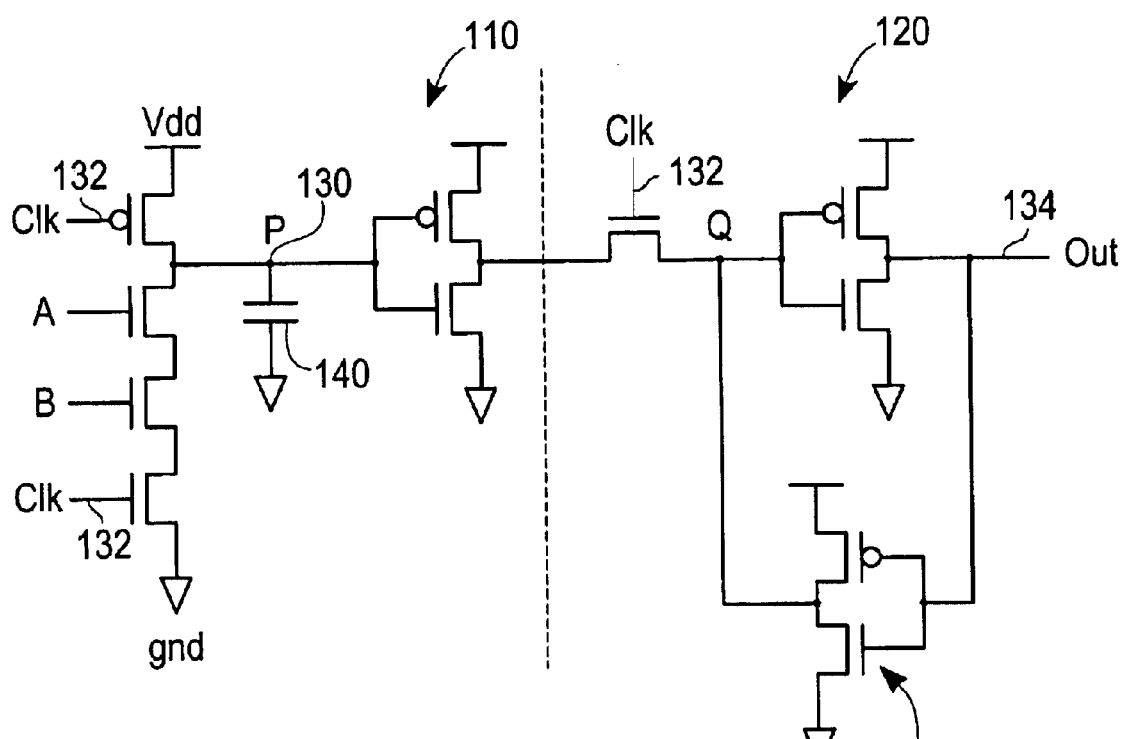
FIG. 1 is a graphical representation of a transistor level description of a circuit comprising a precharged NAND gate and a latch.

FIG. 1 shows a transistor level representation of a sample circuit design that will be used to illustrate how basic functional abstraction may be carried out. For purposes of explaining the abstraction process, the circuit design is shown in graphical form. In actual implementation, however, the circuit is represented to an abstraction mechanism as a netlist. In the netlist, a description language (such as SPICE or SPECTRE, for example) is used to describe the elements of the circuit and the interconnections between the elements.

The circuit of FIG. 1 shows a precharged two-input NAND gate 110 followed by a latch structure 120. In the circuit design shown, the latch structure 120 requires proper sizing of the feedback inverter 122. The feedback inverter 122 should be weak so that it can be overdriven by data at node P 130 when Clk 132 is at logic 1. The latch structure 120 will be abstracted as a latch only if the feedback inverter 122 is weak enough to be overdriven by the forward path.

Figure 2:
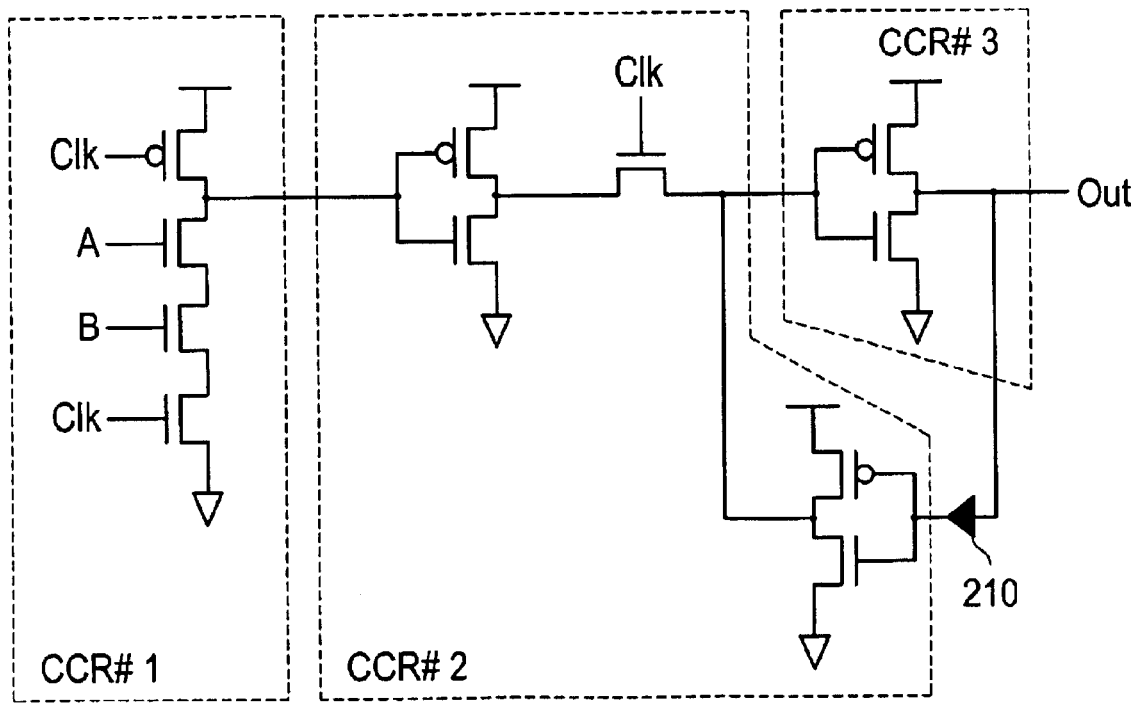
FIG. 2 shows the circuit of FIG. 1 after it has been separated into channel connected regions and rank ordered.

Analysis of the transistor level representation of the circuit design takes place in stages. In a first stage, an abstraction mechanism analyzes the netlist of the design to distinguish the various channel-connected regions (CCR's) of the circuit. A channel-connected region is a group of all transistors connected by source and drain terminals. Two CCR's are connected by gate terminals. In the circuit of FIG. 1, there are three distinct CCR's. These are shown in FIG. 2.

After CCR identification, an abstraction mechanism rank orders or levelizes the CCR's from inputs to outputs. During rank ordering, an abstraction mechanism introduces delays to break feedback loops. As shown in FIG. 2, there is a feedback loop between CCR#3 and CCR#2. Thus, a feedback loop delay 210 is introduced to the netlist to break the feedback loop.

Figure 3:
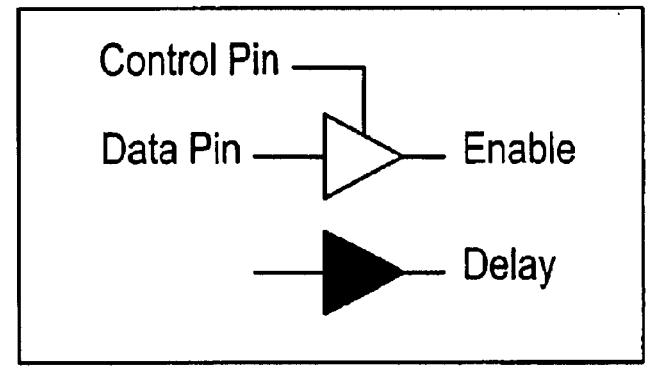
FIG. 3 is a logic level representation of the circuit of FIG. 1 generated using symbolic analysis.
Figure 3:
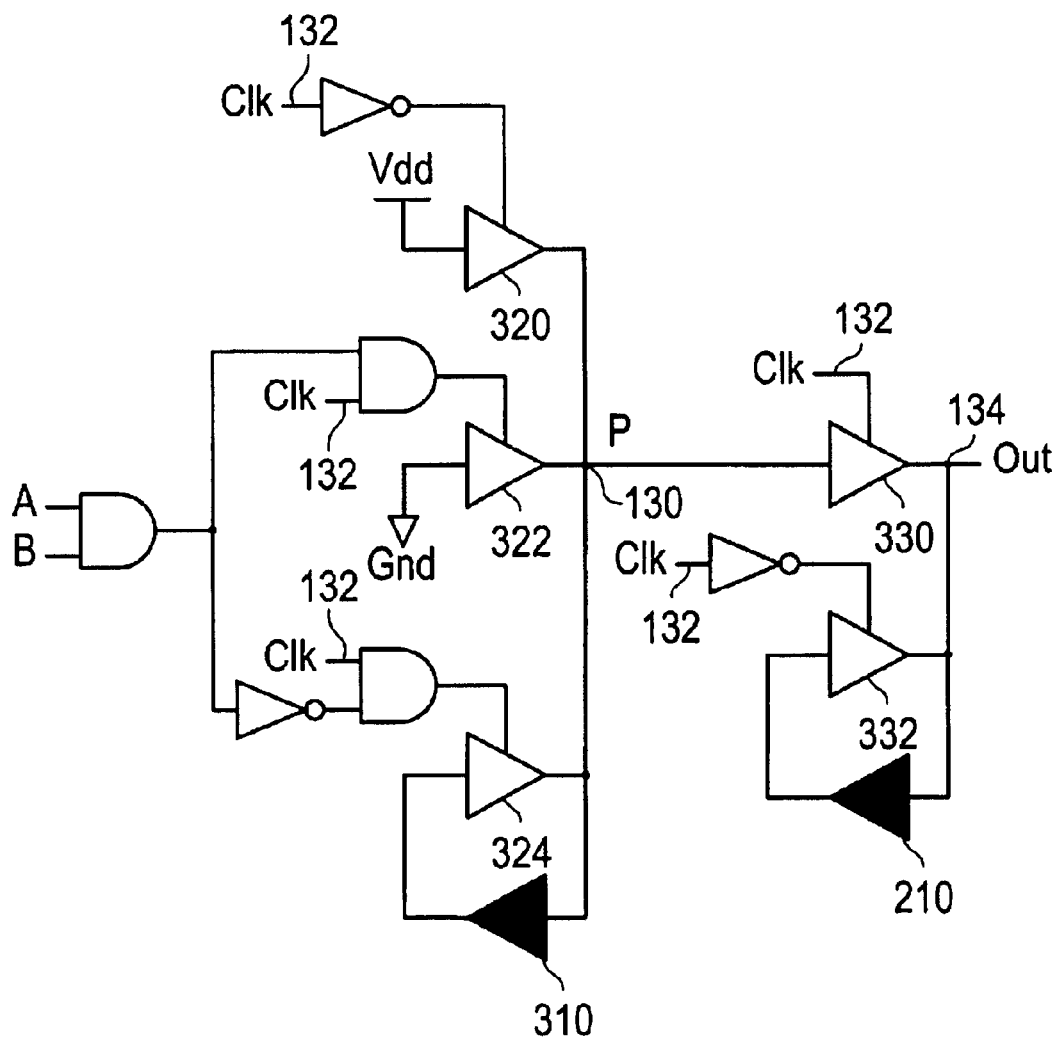

Thereafter, the abstraction mechanism performs symbolic analysis on each of the CCR's to generate an equivalent logic level representation of the circuit. The result of the symbolic analysis process is shown in FIG. 3. As part of the process, charge storage delays such as delay 310 may be introduced to represent the charge storage function of a charge storage element, such as the capacitor 140 of FIG. 1. The process of generating a logic level representation from a transistor level representation using symbolic analysis is known. Thus, it need not be described in detail herein.

In the generated logic level representation of FIG. 3, node P 130 is driven by three enable drivers 320, 322, 324. The top enable driver 320 is activated when Clk 132 is at logic 0 and drives node P 130 to logic 1. This driver 320 corresponds to the path from node P 130 to vdd through the PMOS transistor in FIG. 1. The middle enable driver 322 is activated when Clk 132, input A, and input B are all at logic 1, and drives node P 130 to logic 0. This driver 322 corresponds to the path from P 130 to ground through the chain of NMOS transistors in FIG. 1. The bottom enable driver 324 is activated when Clk 132 is at logic 1 and either input A or input B is at logic 0. This driver 324 corresponds to charge storage on node P 130. The delay 310 is used to model the previous value of node P 130 stored on the capacitance 140 (FIG. 1) on node P 130. As noted above, delay 310 is referred to as a charge storage delay.

A similar explanation can be given for node Out 134. The node Out 134 is driven by two enable drivers 330, 332. The top driver 330 is activated when Clk 132 is at logic 1 and drives node Out 134 to the logic value at node P 130. This driver corresponds to the transparent path from node P 130 to node Out 134 in the netlist of FIG. 1. The bottom enable driver 332 is activated when Clk 132 is at logic 0. When that occurs, node Out 134 stores the previous value of node Out 134. The delay 210 used to model this behavior is the one that was introduced during rank ordering. As noted previously, delay 210 is referred to as a feedback loop delay since it is used to break a feedback loop during rank ordering.

A functional analysis of the logic level representation shown in FIG. 3 will reveal that the enable drivers 320, 322, 324 on node P 130 capture the functionality of a precharge 2-input NAND gate, and that the enable drivers 330, 332 on Node Out 134 capture the functionality of a latch. Thus, the functionality of the transistor-level representation of FIG. 1 is captured by the logic level representation of FIG. 3. As is, the logic level representation may be submitted to an event-level simulator for simulation. However, because it contains explicit delays, the logic level representation cannot be fed to a cycle simulator, an equivalence checker, or an emulator. In other words, it is not cycle ready. To make the representation of the circuit of FIG. 1 cycle ready, further abstraction is needed to remove the explicit delays, and to abstract latch and flip flop structures.

Recognition and Abstraction of Basic Latch

As noted above, the logic level representation of FIG. 3 models a precharge two input NAND gate, and a latch. These two structures are recognized and abstracted separately.

With regard to latch recognition, it is observed that a latch requires an explicit feedback loop to store previous values. Thus, to find a latch candidate, the abstraction mechanism looks for feedback loops. Recall that feedback loop delays are introduced during rank ordering to break up feedback loops; thus, to find a feedback loop, the abstraction mechanism looks for feedback loop delays. According to this observation, the abstraction mechanism finds candidates for a latch output by looking for nodes that provide inputs to feedback loop delays.

After finding a candidate latch output, the abstraction mechanism tries to identify a latch clock. The abstraction mechanism does this by making a "guess" as to which signal may provide the clock signal for the latch. The intuition for guessing the latch clock is that all paths to a candidate latch output should be controlled by the latch clock. The candidate latch output is driven by a set of enable drivers. Thus, all of those enable drivers should be controlled by the latch clock. Accordingly, the candidate latch clock is identified as the first intersection point in a breadth first traversal of the transitive fanin cones of the control pin of all of the enable drivers on the candidate latch output.

After a candidate latch clock is identified, the abstraction mechanism performs functional analysis to determine whether the candidate latch output and the candidate latch clock behave as a latch. In doing so, the abstraction mechanism computes both the negative and positive cofactors of the candidate latch output with respect to the candidate latch clock. The negative cofactor is obtained by restricting the candidate latch clock to logic 0 and computing the Boolean equation for the candidate latch output. The positive cofactor is obtained by restricting the candidate latch clock to logic 1 and again computing the Boolean equation for the candidate latch output. For a latch, one of the cofactors should be a feedback loop. The other cofactor should be devoid of a feedback loop. If both of these conditions are met, then a latch is recognized and abstracted, and the cofactor devoid of the feedback loop is identified as the data for the latch.

To apply this technique, consider the logic level representation shown in FIG. 3. The logic level representation shows node Out 134 as an input to the feedback loop delay 210. Thus, node Out 134 is a candidate for the latch output. There are two enable drivers 330, 332 to node Out 134. The signal Clk 132 is the first intersection point in the transitive fanin of the control pins of the two enable drivers 330, 332. Thus, Clk 132 is identified as the guess for the latch clock.

Figure 4:
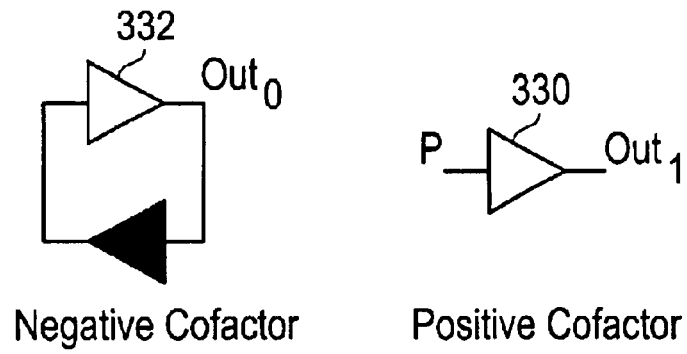
FIG. 4 shows the positive and negative cofactors for the logic level representation of the latch of FIG. 3.
Figure 5:
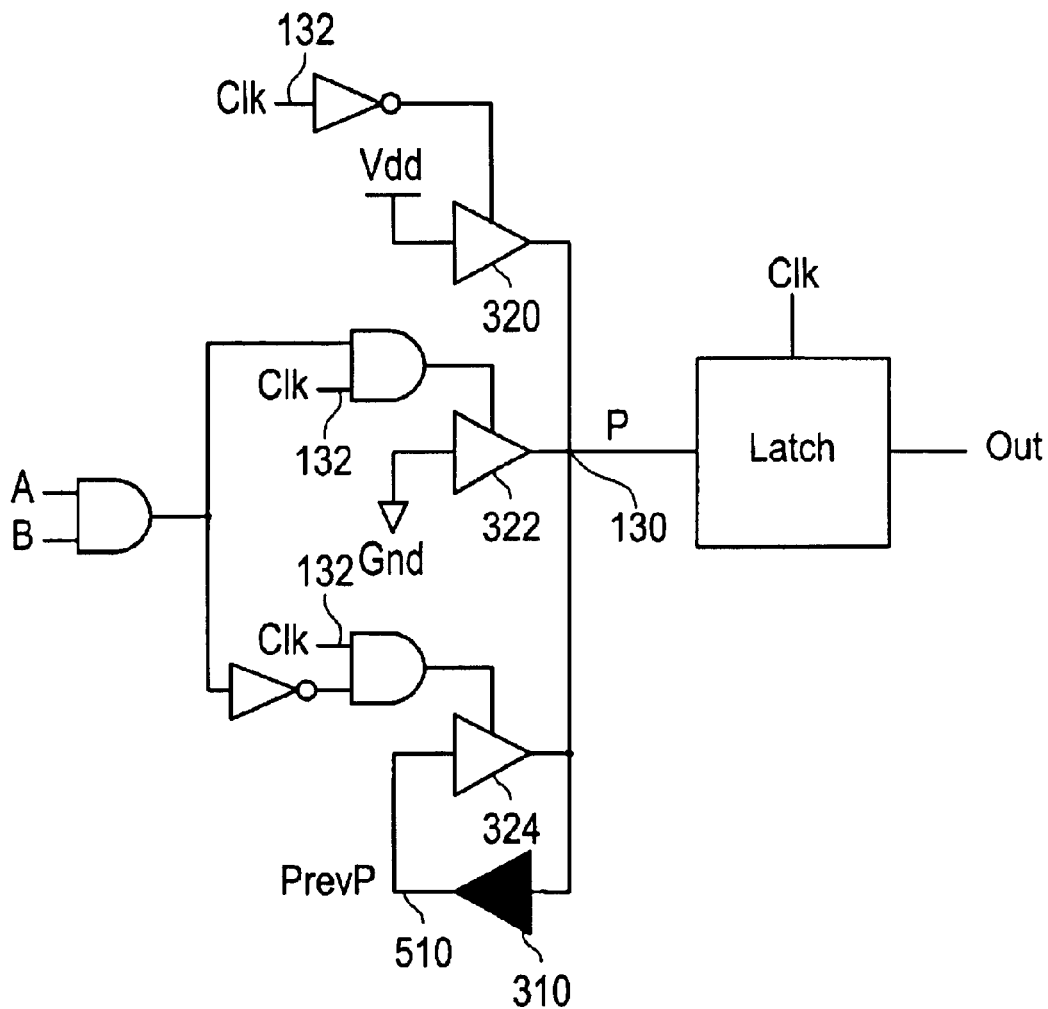
FIG. 5 shows the logic level representation of FIG. 3 after the latch has been abstracted.

Thereafter, the negative and positive cofactors are computed with respect to Clk 132. The negative cofactor is obtained by restricting Clk 132 to logic 0. With Clk 132 at logic 0, driver 330 is disabled and driver 332 is enabled. Thus, as shown in FIG. 4, the result of restricting Clk 132 to logic 0 is a feedback loop that stores the previous value of node Out 134. The positive cofactor is obtained by restricting Clk 132 to logic 1. When this is done, driver 332 is disabled and driver 330 is enabled. The result, as shown in FIG. 4, is that node Out 134 takes on the data value on node P 130. Since one of the cofactors (the negative cofactor) is a feedback loop, and the other cofactor (the positive cofactor) is devoid of a feedback loop, both latch conditions are satisfied. Thus, a latch is recognized and abstracted with the positive cofactor identified as the latch data. This result is shown in FIG. 5.

Recognition and Abstraction of Basic Precharge

A different technique is used to recognize the precharge on the precharge NAND gate. With precharge recognition, a user specifies a clocking scheme. In the following example, it will be assumed for the sake of simplicity that the clocking scheme is a two-phase scheme. However, it should be noted that other clocking schemes (such as a 4 phase non-overlapping scheme) may be specified.

It is observed that precharge structures need capacitive nodes to store the previous value of a node during the evaluate phase. Since capacitive nodes are modeled using charge storage delays, charge storage delays indicate candidates for precharge recognition. Specifically, the node that provides the input to the charge storage delay becomes a precharge candidate.

After a precharge candidate is identified, the abstraction mechanism performs cofactor computations on the logic level representation with respect to each phase of the user-specified clocking scheme to determine whether precharge behavior is exhibited. If a precharge candidate precharges to logic 1 during one of the clock phases, then it is marked as an evaluate candidate for the subsequent clock phases. Cofactor computations are then performed for the candidate evaluate node under the assumption that the previous value of the candidate evaluate node is logic 1. After the cofactor computations are performed, a set of symbolic manipulations and optimizations are performed on the cofactor during the evaluate phase. The resultant cofactor represents the results of precharge recognition on the precharge candidate.

To apply this technique, consider the logic level representation shown in FIG. 5, which is obtained after latch recognition and abstraction has been performed. As shown, the charge storage delay 310 receives its input from node P 130. Thus, node P 130 becomes a precharge candidate. Assume that the user specifies a simple two phase clocking scheme, where Clk 132 is logic 0 in the first phase and logic 1 in the second phase. Cofactor computation is performed on node P 130 by initially restricting Clk 132 to logic 0 (the first phase of the Clk 132). With Clk 132 at logic 0, drivers 322 and 324 are disabled, and driver 320 is enabled; thus, node P 130 precharges to logic 1. As a result, node P 130 is identified as a candidate evaluate node. Since Clk 132 is at logic 0, the precharge is not consumed by the downstream latch.

Figure 6:
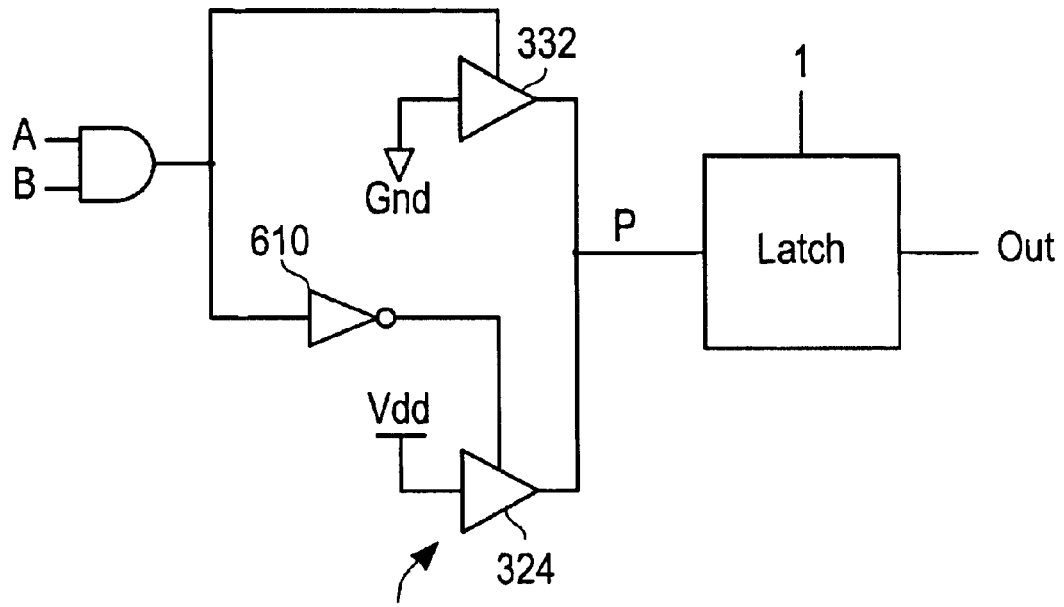
FIG. 6 shows a cofactor for the logic level representation of the precharged NAND gate of FIG. 3 after the precharge has been propagated and the Clk is restricted to logic 1.
Figure 7:
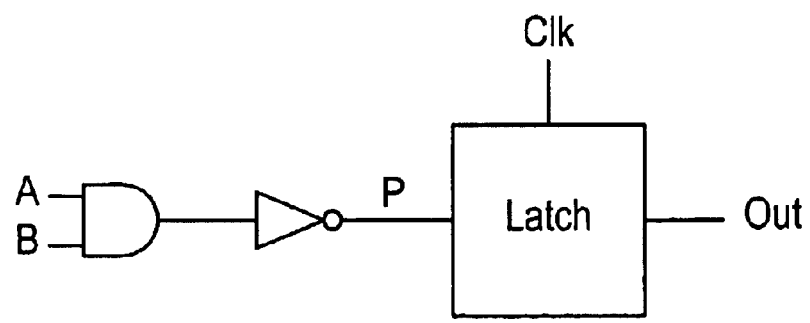
FIG. 7 shows the circuit of FIG. 1 after the precharged NAND gate and the latch have been abstracted.

Cofactor computation is then performed on the candidate evaluate node P 132 under the assumption that the previous value of the node is a logic 1. To do this, the precharge on node P 130 is propagated through the charge storage delay 310. This operation can be viewed as a "stuck at logic 1" condition on node PrevP 510. The "stuck at logic 1" condition models the fact that the previous value of node P 130 is logic 1. Cofactor computation is then performed on the logic level representation for the second phase of the Clk 132 (i.e. Clk 132 is restricted to logic 1). The resultant cofactor for this computation is shown in FIG. 6. Functional analysis of this logic level representation reveals that the drivers 322, 324 and inverter 610 behave as an inverter. Thus, applying a set of symbolic manipulations and optimizations to the gate lever representation produces the equivalent NAND representation shown in FIG. 7. The precharge NAND gate is thus recognized and abstracted. This abstraction of the precharge NAND gate is valid under the assumption that the inputs (A and B) are held stable during the evaluate phase of the Clk 132.

Recognition and Abstraction of Precharged Latches

The techniques discussed above may be used to recognize and abstract basic latches and precharge on basic gates. They cannot, however, be used to recognize and abstract a precharged latch. For such abstraction, a significantly revised technique is needed.

Figure 8:
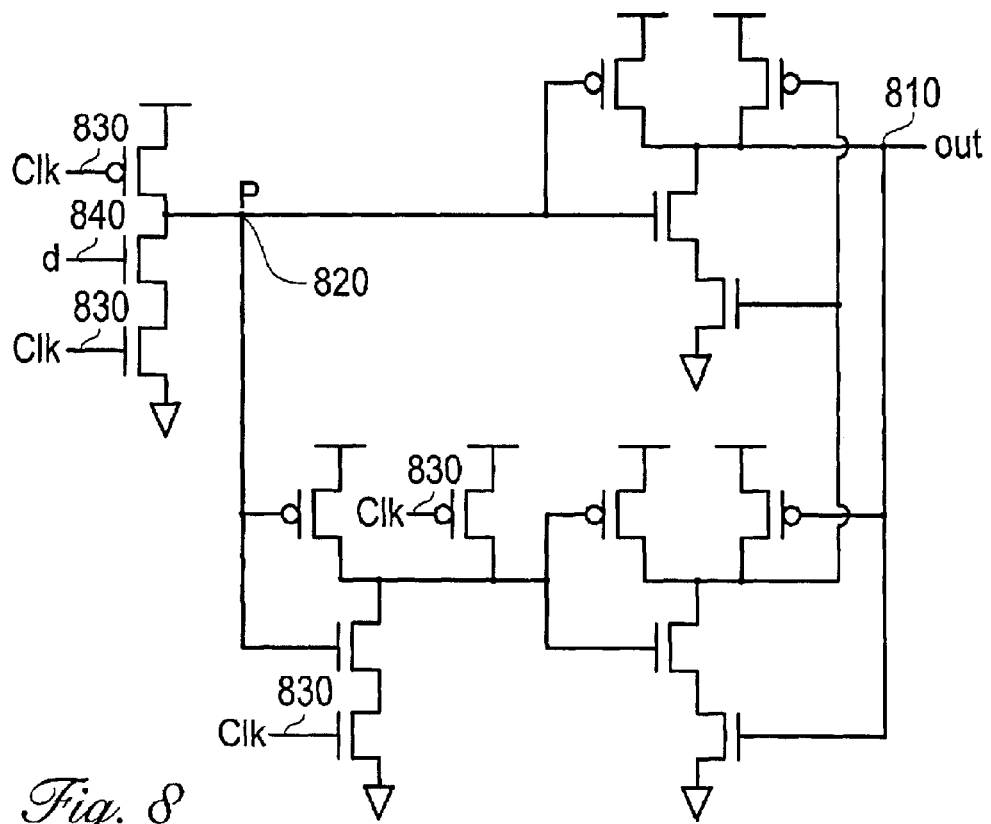
FIG. 8 is a graphical representation of a transistor level description of a sample precharged latch structure.
Figure 13:
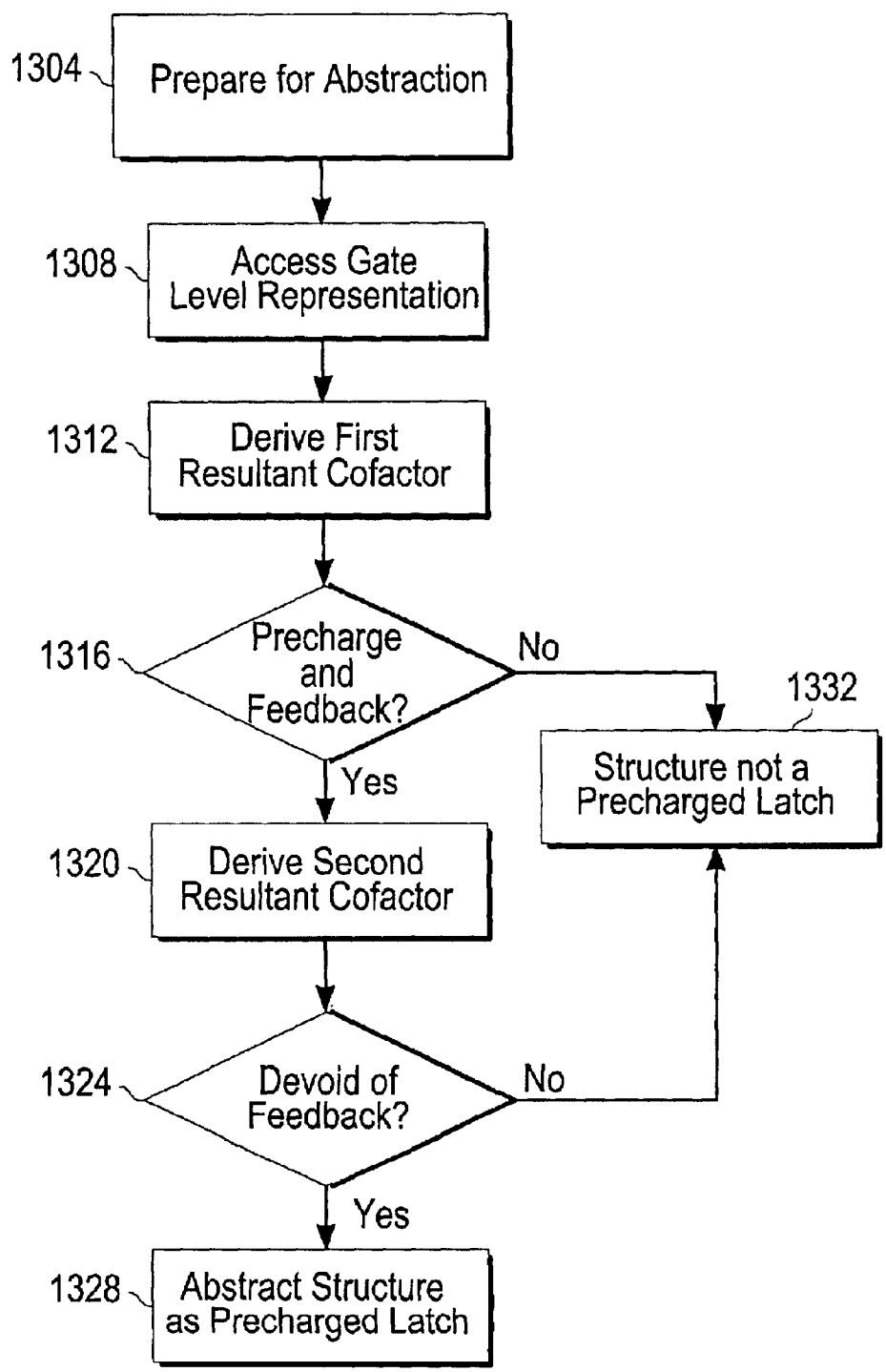
FIG. 13 is a flow diagram of one embodiment of a technique for recognizing and abstracting precharged latches.

To describe one embodiment of a technique that may be used to recognize and abstract a precharged latch, reference will be made to the sample circuit of FIG. 8. FIG. 8 shows a transistor level representation of a precharged latch. Reference will also be made to FIG. 13, which shows a flow diagram for one embodiment of the technique. The operations shown in the flow diagram are performed by an abstraction mechanism.

Figure 9:
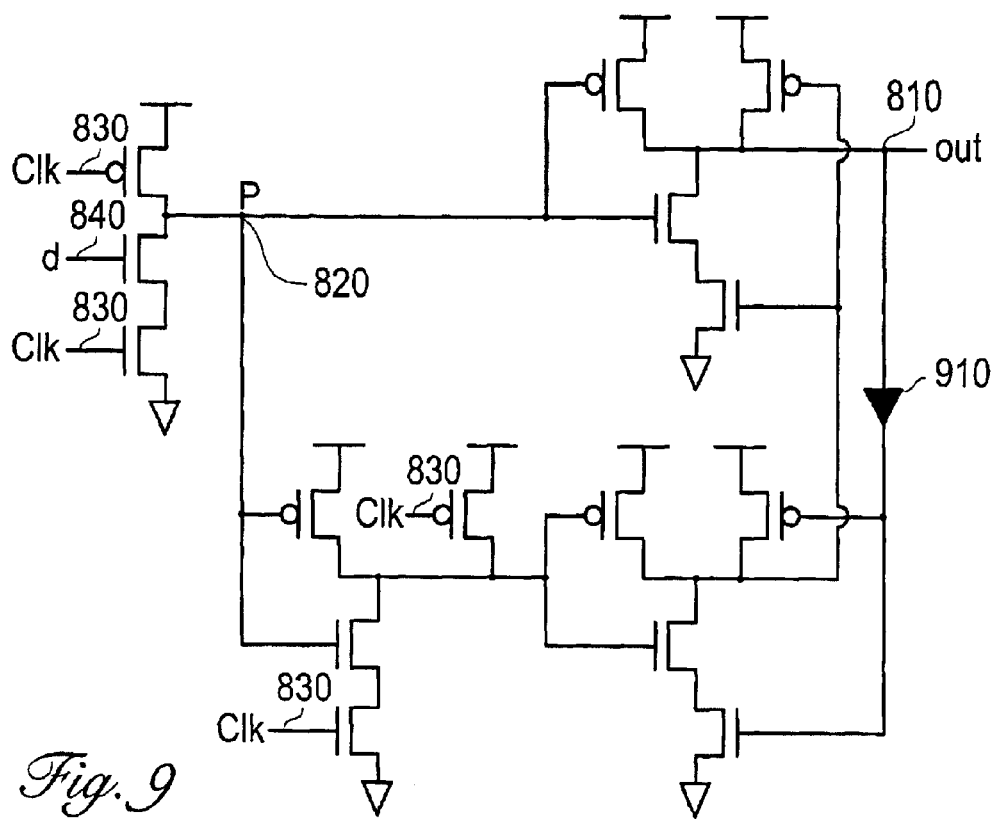
FIG. 9 shows the structure of FIG. 8 after it has been rank ordered.

As shown in FIG. 13, the abstraction mechanism begins analysis of the precharged latch structure of FIG. 8 by preparing (1304) the structure for abstraction. In one embodiment, the structure is submitted to the abstraction mechanism in the form of a netlist. The abstraction mechanism performs a number of actions on this netlist to prepare it for functional abstraction. In one embodiment, the abstraction mechanism initially analyzes the netlist to determine all of the different CCR's in the netlist. The abstraction mechanism then rank orders the CCR's from inputs to outputs. During rank ordering, the abstraction mechanism introduces delays to break feedback loops. In the structure of FIG. 8, there is a feedback loop at node Out 810. Thus, a feedback loop delay 910 (FIG. 9) is introduced into the netlist to break the feedback loop. The result of rank ordering is shown in FIG. 9. After the netlist is rank ordered, the abstraction mechanism performs symbolic analysis on the netlist to generate a logic level representation of the structure. The result of symbolic analysis is shown in FIG. 10.

As shown, node P 820 is driven by three enable drivers 1010, 1012, 1014. The top enable driver 1010 precharges node P 820 when Clk 830 is at logic 0. The middle enable driver 1012 is activated when both Clk 830 and d 840 (the data signal) are at logic 1. The bottom enable driver 1014 is activated when Clk 830 is at logic 1 and d 840 is at logic 0. This driver 1014 corresponds to charge storage on node P 820 (notice the charge storage delay 1020 introduced during symbolic analysis). The node Out 810 is driven by a pair of cross-coupled NAND gates. The feedback loop between the cross-coupled NAND gates is broken by the feedback loop delay 910 introduced during rank ordering.

Figure 10:
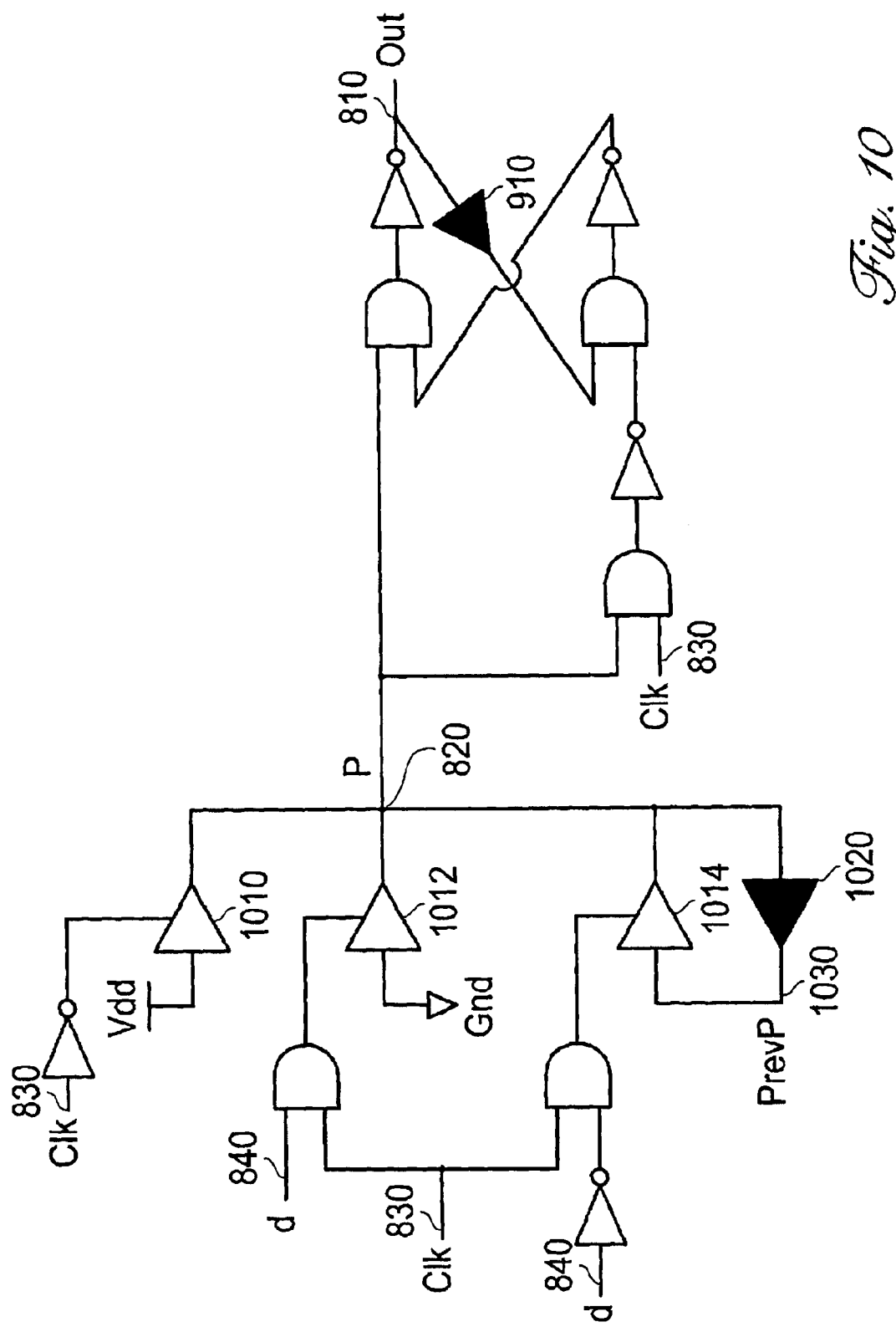
FIG. 10 is a logic level representation of the structure of FIG. 8 generated using symbolic analysis.

After the initial logic level representation shown in FIG. 10 is generated, the abstraction mechanism proceeds to attempt to further abstract the structure. In doing so, the abstraction mechanism accesses (1308) the logic level representation of FIG. 10. Based upon the logic level representation, the abstraction mechanism derives (1312) a first resultant cofactor. In one embodiment, the abstraction mechanism derives the cofactor by performing cofactor computation on the logic level representation while restricting the Clk 830 to a certain logic value.

Figure 11:
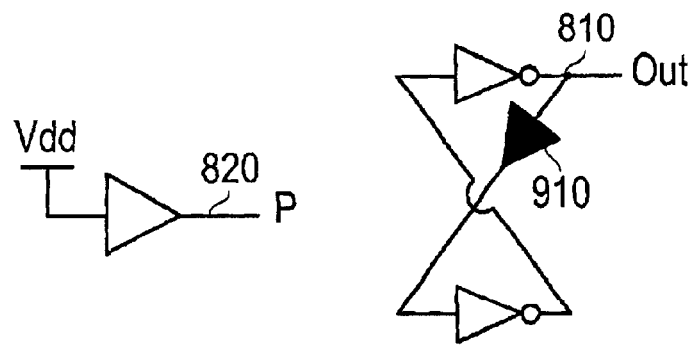
FIG. 11 shows a first resultant cofactor for the logic level representation of FIG. 8.

To illustrate, assume that a user specifies a simple two phase clocking scheme, where Clk 830 is at logic 0 on the first phase and logic 1 on the second phase (note: other clocking schemes may be specified if so desired). Assume further that the first resultant cofactor is computed on the first phase of the Clk 830 (i.e. Clk 830 is restricted to logic 0). With Clk 830 restricted to 0, the resultant cofactor for the logic level representation is that shown in FIG. 11. This cofactor shows that when Clk 830 is at logic 0, node P 820 precharges to logic 1, and node Out 810 holds its previous value.

After the first resultant cofactor is computed, the abstraction mechanism proceeds to determine (1316) whether the cofactor indicates: (1) that node P 820 is experiencing a precharge; and (2) that node Out 810 is part of a feedback loop. If the cofactor indicates both to be true, then in one embodiment, the abstraction mechanism concludes that node Out 810 is a precharged latch candidate. Otherwise, the abstraction mechanism may conclude (1332) that the structure is not a precharged latch.

In the present example, the first resultant cofactor indicates that node Out 810 is a precharged latch candidate. Thus, the abstraction mechanism proceeds to derive (1320) a second cofactor. In one embodiment, the second cofactor is derived by propagating the precharge through a charge storage delay 1020, and then performing cofactor computations on the logic level representation based upon another phase of the Clk 830.

Figure 12:
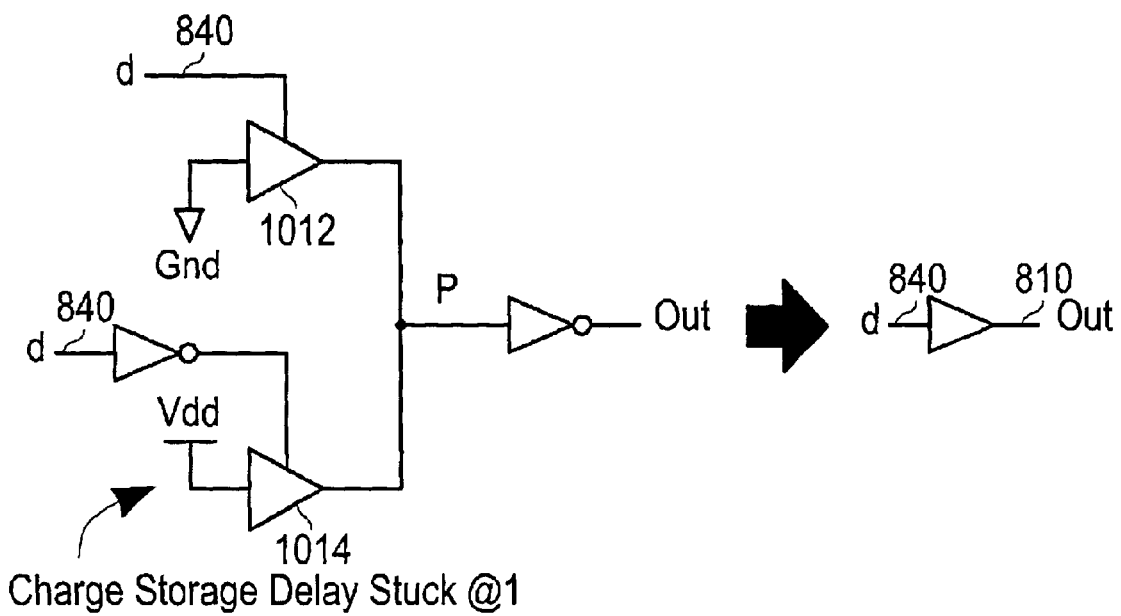
FIG. 12 shows a second resultant cofactor for the logic level representation of FIG. 8.

With reference to the present example, the second resultant cofactor is derived by first propagating the precharge on node P 820 through the charge storage delay 1020. This operation can be viewed as a "stuck at 1" condition at node PrevP 1030. The "stuck at 1" condition models the fact that the previous value of node P 820 was logic 1. Hence, the current value of node PrevP 1030 is now logic 1. With node PrevP 1030 set at logic 1, the abstraction mechanism performs cofactor computation on the logic level representation based upon a second phase of the Clk 830 (i.e. Clk 830 is restricted to logic 1). The resultant cofactor with the "stuck at 1" assumption is shown in FIG. 12. With some symbolic manipulations and optimizations, this cofactor reveals that there is a transparent path from the data signal d 840 to node Out 810.

After the second resultant cofactor is derived, the abstraction mechanism determines (1324) whether the second resultant cofactor is devoid of a feedback loop. If so, then it is determined that all of the indications of a precharged latch are found. Namely, the cofactors indicate: (1) that a precharge is experienced; (2) that one of the cofactors indicates a feedback loop is present to hold a previous value; and (3) that the other cofactor is devoid of a feedback loop. If that is the case, the structure represented by the logic level representation is recognized and abstracted (1328) as a precharged latch. On the other hand, if the second cofactor is not devoid of a feedback loop, then the abstraction mechanism may conclude (1332) that the structure is not a precharged latch. In the present example, the second resultant cofactor is devoid of a feedback loop. Consequently, the structure of FIG. 10 is recognized and abstracted as a precharged latch with the second cofactor identified as the data for the latch.

Recognition and Abstraction of Precharged Flip-Flops

A revised technique is used to recognize and abstract the more complex structure of a precharged flip-flop. To describe this technique, reference will be made to the sample circuit shown in FIG. 14, which depicts a graphical representation of a transistor level netlist for a precharged flip-flop. This flip-flop uses a precharge phase to precharge nodes P1 1410 and P2 1412 to logic 1. The cross-coupled NAND gates 1450, 1452 (for the sake of simplicity, the NAND gates are shown as gates rather than their transistor level equivalents) at node Out 1420 hold the previous state during the precharge phase. At the positive edge of Clk 1430, node P1 1410 gets the inverted form of the logic value at data node (or data signal) d 1440. Node P2 1412 gets the logic value at data node d 1440. Node Out 1420 gets the logic value at node d 1440. Note that this circuit functions as a flip-flop since the logic value at node d 1440 propagates to the output node Out 1420 only at the positive edge of Clk 1430.

Figure 14:
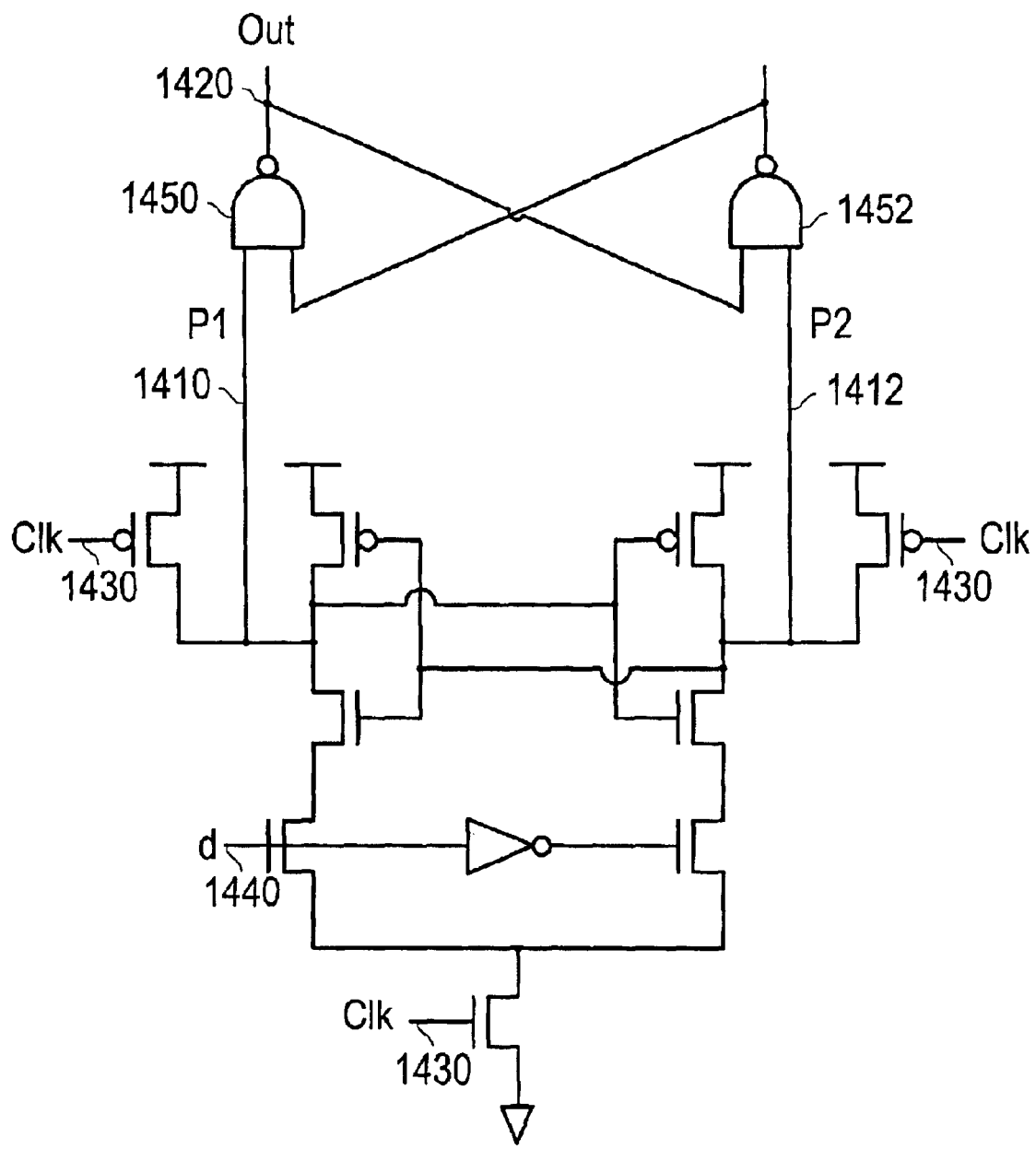
FIG. 14 is a graphical representation of a transistor level description of a sample precharged flip-flop structure.
Figure 15:
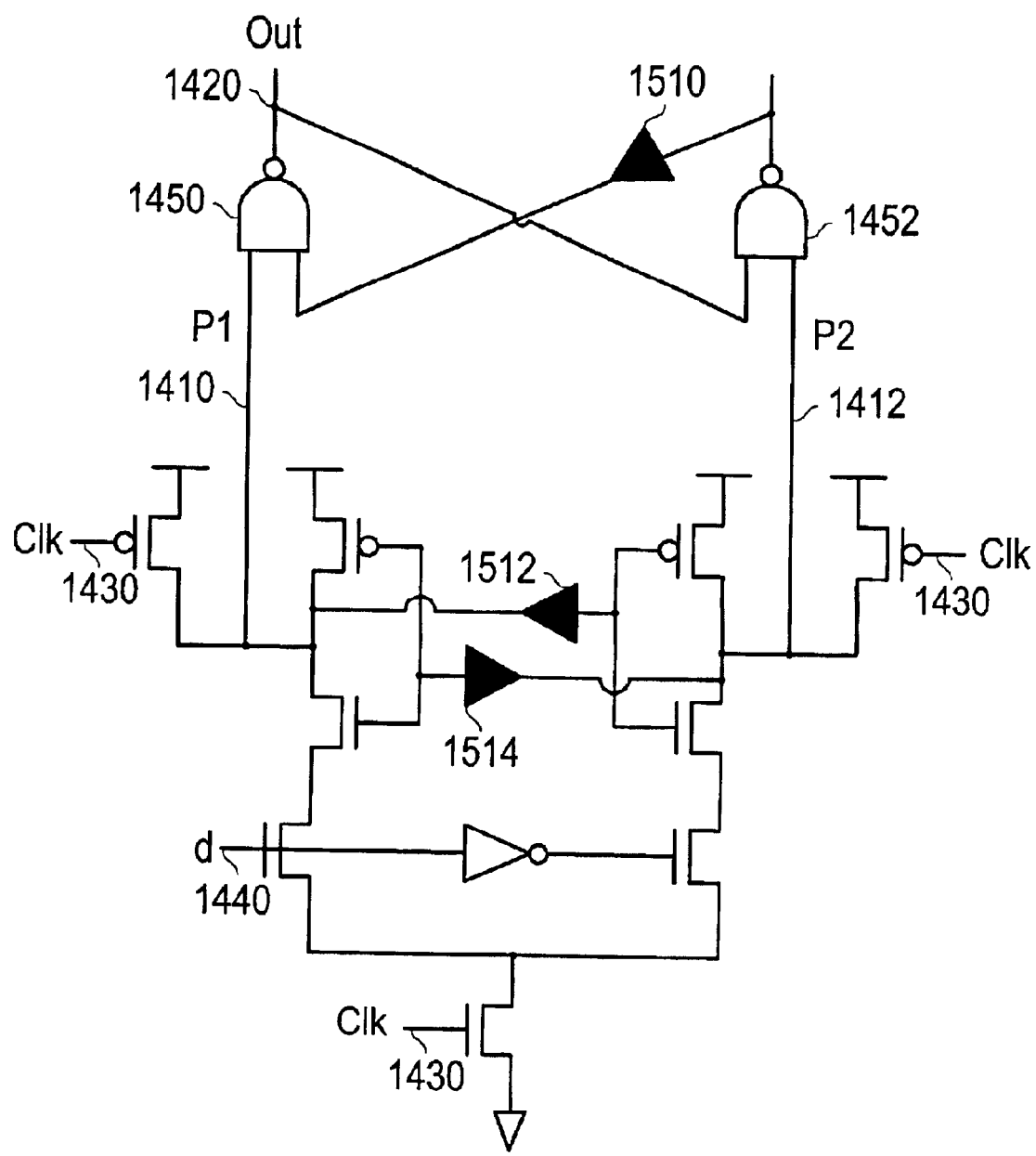
FIG. 15 shows the structure of FIG. 14 after it has been rank ordered.
Figure 21:
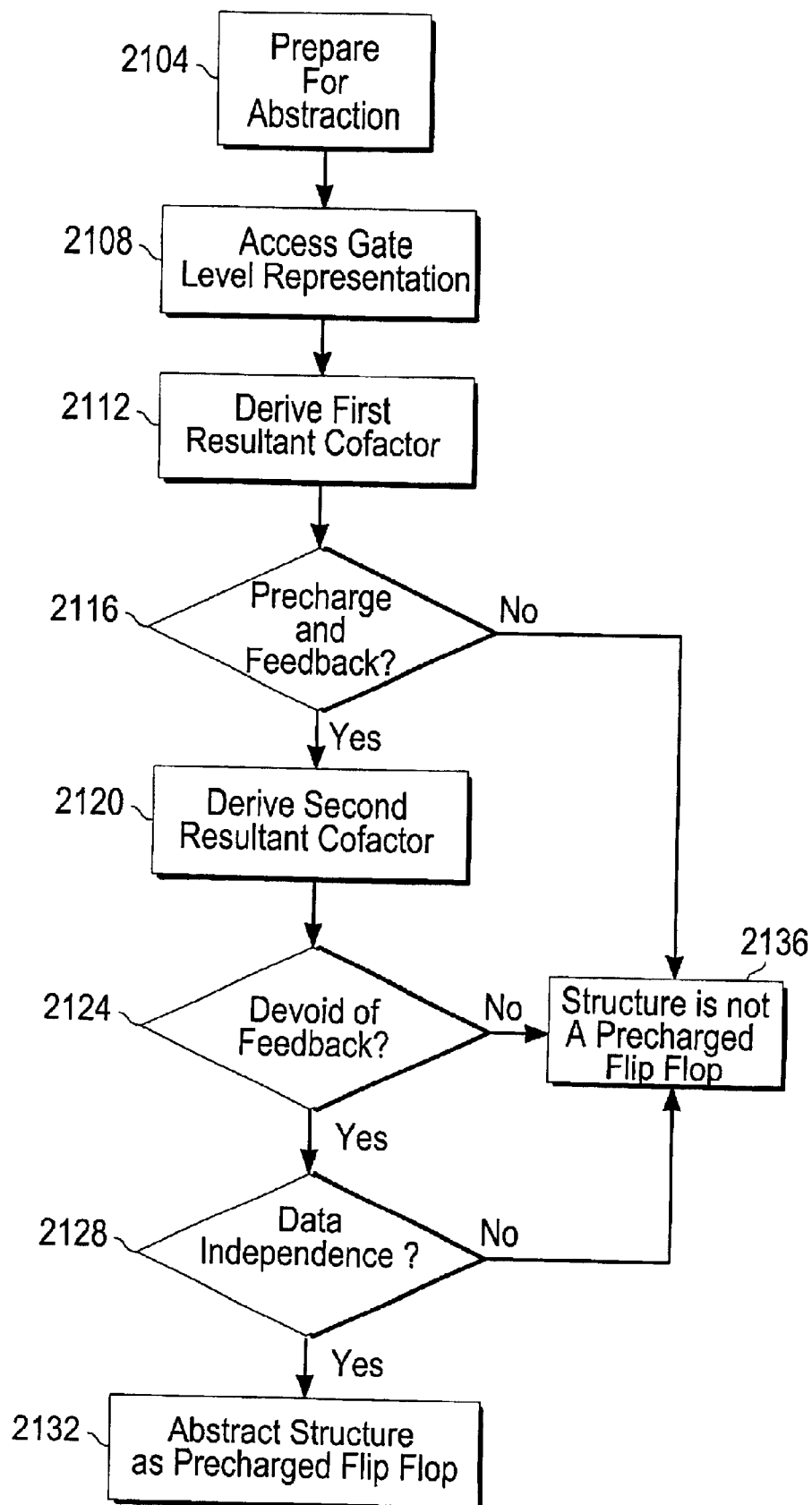
FIG. 21 is a flow diagram of one embodiment of a technique for recognizing and abstracting precharged flip-flops.

To describe one embodiment of a technique that may be used to recognize and abstract a precharged flip-flop, reference will be made to the flow diagram of FIG. 21. In one embodiment, the technique of FIG. 21 is implemented by an abstraction mechanism. As shown, the abstraction mechanism begins analysis of the precharged flip-flop structure by preparing (2104) the structure for abstraction. In doing so, the abstraction mechanism analyzes the netlist to determine all of the different CCR's in the netlist. The abstraction mechanism then rank orders the CCR's from inputs to outputs. During rank ordering, the abstraction mechanism introduces delays to break feedback loops. In the structure of FIG. 14, there are three feedback loops. Thus, three delays are introduced into the netlist. The result of rank ordering is shown in FIG. 15, with the three delays 1510, 1512, and 1514 clearly indicated.

Figure 16:
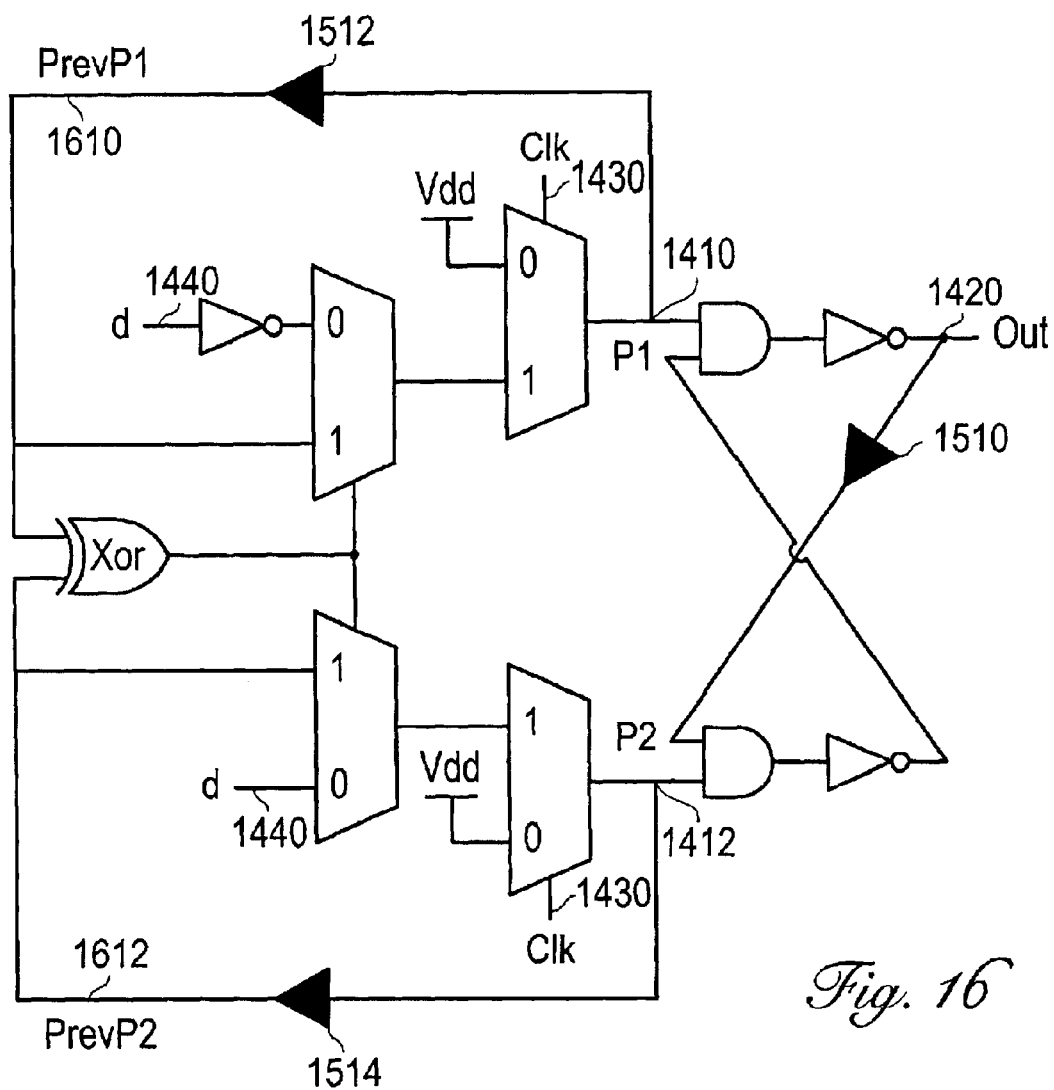
FIG. 16 shows a MUX-XOR equivalent of a logic level representation of the structure of FIG. 14.

After the netlist is rank ordered, the abstraction mechanism performs symbolic analysis on the netlist to generate a logic level representation of the structure. In this case, symbolic analysis generates a rather complicated logic level representation in terms of AND, NOT, and DELAY primitives. Rather than showing this complex logic level representation, a MUX-XOR equivalent of the logic level representation is shown in FIG. 16 to facilitate discussion. The MUX-XOR equivalent captures all of the functionality of the generated logic level representation. According to the MUX-XOR equivalent, when the Clk 1430 is at logic 0, nodes P1 1410 and P2 1412 precharge to logic 1. The cross-coupled NAND gates driving node Out 1420 will hold the previous state. When Clk 1430 goes to logic 1, values at nodes P1 1410 and P2 1412 will depend on the XOR of the previous values on nodes P1 1410 and P2 1412. At the positive edge of Clk 1430, the previous values on nodes P1 1410 and P2 1412 will be logic 1 (the precharged values). Thus, the XOR computes to logic 0 and node P1 1410 gets the inverted form of the value at node d 1440, and node P2 1412 gets the value at node d 1440. Consequently, node Out 1420 obtains the value at node d 1440. Now, nodes P1 1410 and P2 1412 are complements of each other. As a result, the XOR evaluates to logic 1, and nodes P1 1410 and P2 1412 hold their previous values. This implies that node Out 1420 is insulated from changes on node d 1440 when Clk 1430 is at logic 1. As this discussion shows, the MUX-XOR equivalent correctly captures the functionality of a flip-flop.

Returning to FIG. 21, after the structure is prepared for abstraction, the abstraction mechanism proceeds to attempt to further abstract the structure. In doing so, the abstraction mechanism accesses (2108) the logic level representation of the structure. Based upon the logic level representation, the abstraction mechanism derives (2112) a first resultant cofactor. In one embodiment, the abstraction mechanism derives the cofactor by performing cofactor computation on the logic level representation while restricting the Clk 1430 to a certain logic value.

Figure 17:
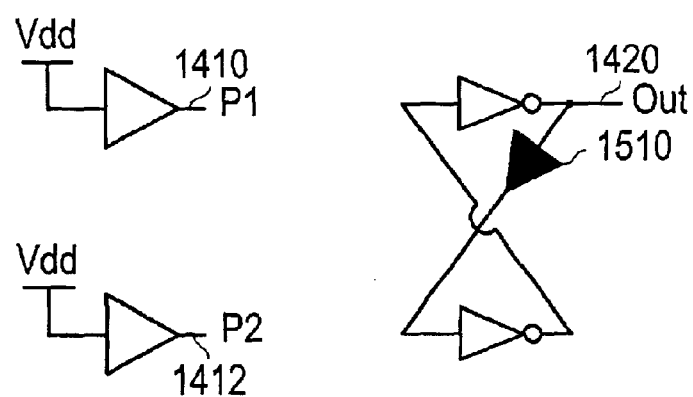
FIG. 17 shows a first resultant cofactor for the MUX-XOR equivalent of FIG. 16.

To illustrate, assume that a user specifies a simple two phase clocking scheme, where Clk 1430 is at logic 0 on the first phase and logic 1 on the second phase (note: other clocking schemes may be specified if so desired). Assume further that the first resultant cofactor is computed on the first phase of the Clk 1430 (i.e. Clk 1430 is restricted to logic 0). With Clk 1430 at logic 0, the resultant cofactor for the logic level representation is that shown in FIG. 17. As shown, nodes P1 1410 and P2 1420 precharge to logic 1. Node Out 1420 holds its previous value.

After the first resultant cofactor is computed, the abstraction mechanism proceeds to determine (2116) whether the cofactor indicates: (1) that node P1 1410 is experiencing a precharge; (2) that node P2 1412 is experiencing a precharge; and (3) that node Out 1420 is part of a feedback loop. If the cofactor indicates that all of these are true, then the abstraction mechanism concludes that node Out 1420 is a precharged flip-flop candidate. Otherwise, the abstraction mechanism may conclude (2136) that the structure is not a precharged flip-flop.

In the present example, the first resultant cofactor indicates that node Out 1420 is a precharged flip-flop candidate. Thus, the abstraction mechanism proceeds to derive (2120) a second resultant cofactor. In one embodiment, the second cofactor is derived by propagating the precharges through the delays 1512, 1514, and then performing cofactor computation on the logic level representation based upon another phase of the Clk 1420.

With reference to the present example, the second resultant cofactor is derived by propagating the precharge on node P1 1410 through delay 1512, and the precharge on node P2 1412 through delay 1514. This operation can be viewed as a "stuck at 1" condition on nodes PrevP1 1610 and PrevP2 1612. The "stuck at 1" condition models the fact that the previous values on nodes P1 1410 and P2 1412 were logic 1. Hence, the current values on nodes PrevP1 1610 and PrevP2 1612 are now logic 1.

Figure 18:
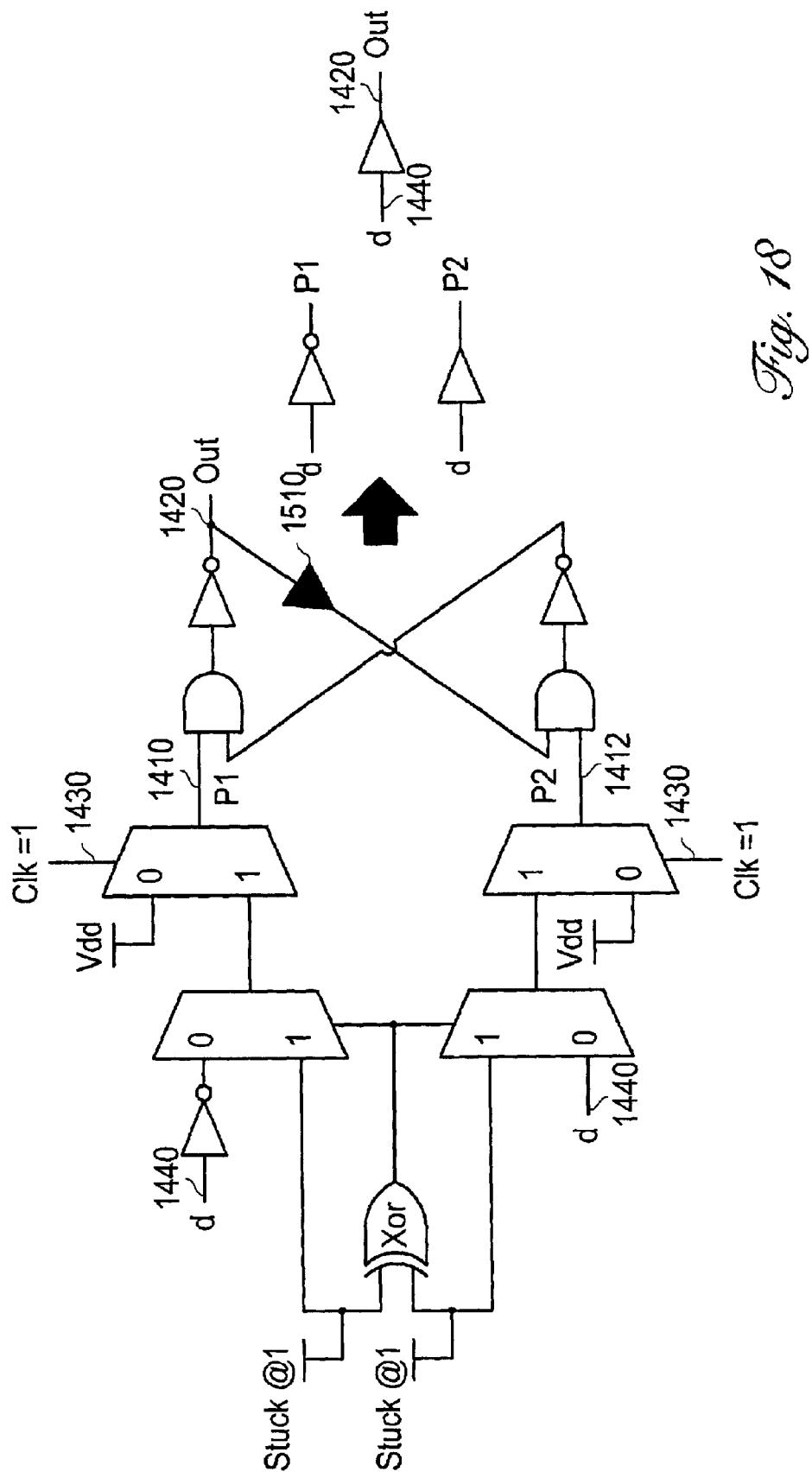
FIG. 18 shows a second resultant cofactor for the MUX-XOR equivalent of FIG. 16.

With nodes PrevP1 1610 and PrevP2 1612 set at logic 1, the abstraction mechanism performs cofactor computation on the logic level representation based upon a second phase of the Clk 1430 (i.e. Clk 1430 is restricted to logic 1). The resultant cofactor with the "stuck at 1" assumption is shown in FIG. 18. With some symbolic manipulations and optimizations, this cofactor can be optimized as shown in FIG. 18 to reveal that there is a transparent path from the data node d 1440 to node Out 1420.

After the second resultant cofactor is derived, the abstraction mechanism determines (2124) whether the second cofactor is devoid of a feedback loop. If so, then the precharged flip-flop candidate is still a candidate. If not, then the abstraction mechanism may conclude (2136) that the structure is not a precharged flip-flop. In the present example, the second cofactor is devoid of a feedback loop. Thus, the abstraction mechanism proceeds further with the abstraction process.

In proceeding further, the abstraction mechanism determines (2128) whether, under certain conditions, the precharged flip-flop candidate (node Out 1420) takes on logic values that are independent of the data on data node d 1440. If so, then the structure can be abstracted (2132) as a precharged flip-flop. If not, then the abstraction mechanism may conclude (2136) that the structure is not a precharged flip-flop. In one embodiment, the abstraction mechanism makes the data independence determination by further computing cofactors.

Figure 19:
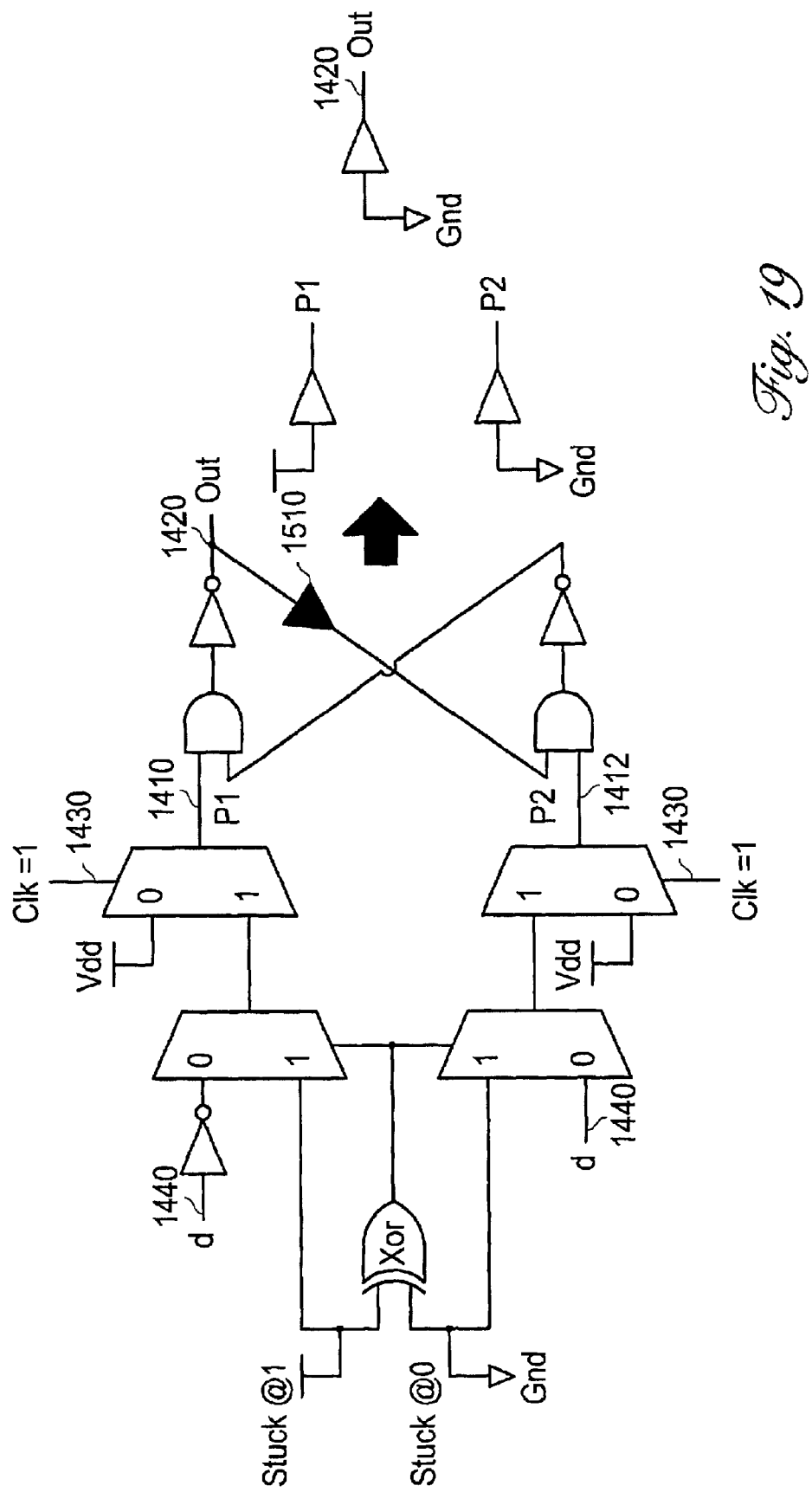
FIG. 19 shows yet another cofactor for the MUX-XOR equivalent of FIG. 16.
Figure 20:
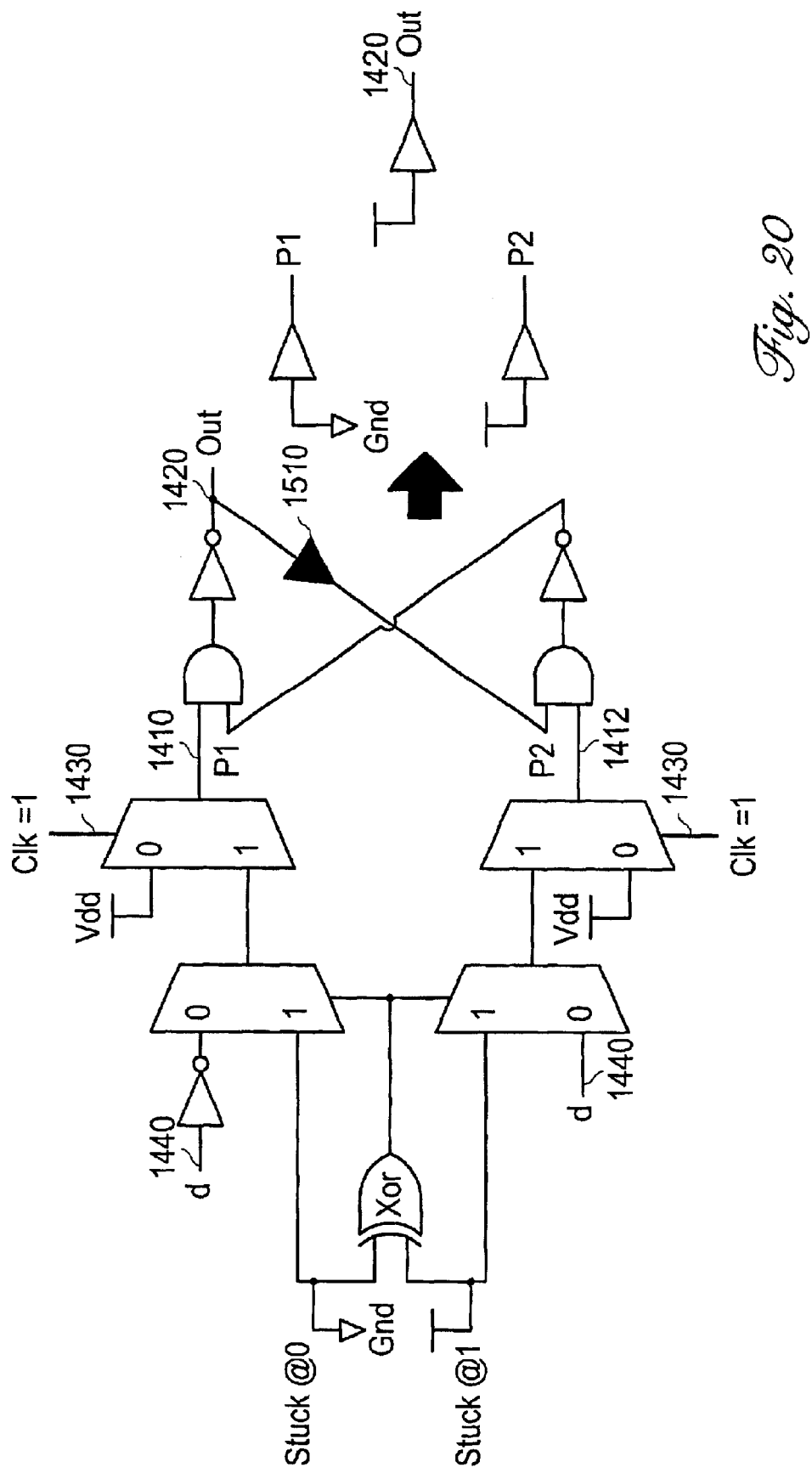
FIG. 20 shows yet another cofactor for the MUX-XOR equivalent of FIG. 16.

Specifically, it is recognized that the value at node Out 1420 when Clk 1430 is at logic 1 is a function of the previous logic values on nodes P1 1410 and P2 1412. The second resultant cofactor derived above with Clk 1430 at logic 1 was done under the "stuck at 1" assumption since logic 1 was the previous value on nodes P1 1410 and P2 1412 as a result of the precharge. It is observed, however, that after the positive edge of Clk 1430, nodes P1 1410 and P2 1412 are no longer both at logic 1 but rather become complements of each other. That being the case, the abstraction mechanism computes two additional cofactors with Clk 1430 at logic 1, assuming that the previous values of nodes P1 1410 and P2 1412 are complements of each other. This corresponds to a cofactor computation with Clk at logic 1, node PrevP1 1610 at logic 1, and node PrevP2 1612 at logic 0, and another cofactor computation with Clk 1430 at logic 1, node PrevP1 1610 at logic 0, and node PrevP2 1612 at logic 1. The cofactor for the case with Clk at logic 1, node PrevP1 1610 at logic 1, and node PrevP2 1612 at logic 0 is shown in FIG. 19. The cofactor for the case with Clk at logic 1, node PrevP1 1610 at logic 0, and node PrevP2 1612 at logic 1 is shown in FIG. 20. In both cases, the logic value at node Out 1420 evaluates to a constant value, which means that the logic value at node Out 1420 is independent of the logic value on the data node d 1440. This implies that once nodes P1 1410 and P2 1412 become complements of each other, node Out 1420 is insulated from changes at node d 1440. This indicates flip-flop behavior. Thus, the structure can be abstracted as a precharged flip-flop.

Hardware Overview

Figure 22:
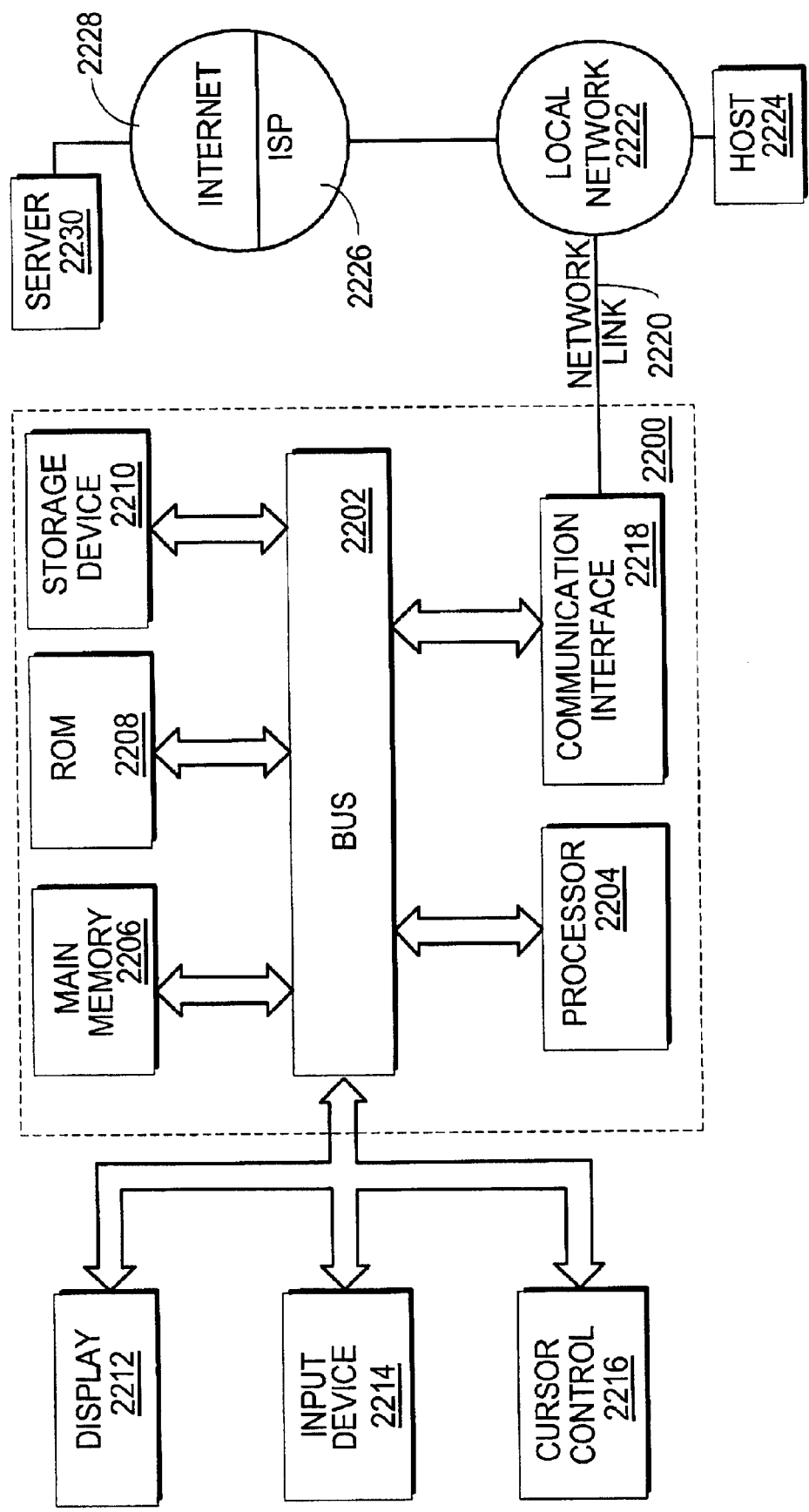
FIG. 22 is a block diagram of a sample computer system in which one embodiment of the abstraction mechanism may be implemented.

In one embodiment, the abstraction mechanism of the present invention is implemented as a set of instructions executable by one or more processors. The invention may be implemented, for example, as part of an object oriented programming system. FIG. 22 shows a hardware block diagram of a computer system 2200 on which the abstraction mechanism may be implemented. Computer system 2200 includes a bus 2202 or other communication mechanism for communicating information, and a processor 2204 coupled with bus 2202 for processing information. Computer system 2200 also includes a main memory 2206, such as a random access memory (RAM) or other dynamic storage device, coupled to bus 2202 for storing information and instructions to be executed by processor 2204. Main memory 2206 may also be further used to store temporary variables or other intermediate information during execution of instructions by processor 2204. Computer system 2200 further includes a read only memory (ROM) 2208 or other static storage device coupled to bus 2202 for storing static information and instructions for processor 2204. A storage device 2210, such as a magnetic disk or optical disk, is provided and coupled to bus 2202 for storing information and instructions.

Computer system 2200 may be coupled via bus 2202 to a display 2212, such as a cathode ray tube (CRT), for displaying information to a computer user. An input device 2214, including alphanumeric and other keys, is coupled to bus 2202 for communicating information and command selections to processor 2204. Another type of user input device is cursor control 2216, such as a mouse, a trackball, or cursor direction keys for communicating direction information and command selections to processor 2204 and for controlling cursor movement on display 2212. This input device typically has two degrees of freedom in two axes, a first axis (e.g., x) and a second axis (e.g., y), that allows the device to specify positions in a plane.

According to one embodiment, the functionality of the present invention is provided by computer system 2200 in response to processor 2204 executing one or more sequences of one or more instructions contained in main memory 2206. Such instructions may be read into main memory 2206 from another computer-readable medium, such as storage device 2210. Execution of the sequences of instructions contained in main memory 2206 causes processor 2204 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 2204 for execution. Such a medium may take many forms, including but not limited to, non-volatile media, volatile media, and transmission media. Non-volatile media includes, for example, optical or magnetic disks, such as storage device 2210. Volatile media includes dynamic memory, such as main memory 2206. Transmission media includes coaxial cables, copper wire and fiber optics, including the wires that comprise bus 2202. Transmission media can also take the form of acoustic or electromagnetic waves, such as those generated during radio-wave, infra-red, and optical data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 2204 for execution. For example, the instructions may initially be carried on a magnetic disk of a remote computer. The remote computer can load the instructions into its dynamic memory and send the instructions over a telephone line using a modem. A modem local to computer system 2200 can receive the data on the telephone line and use an infra-red transmitter to convert the data to an infra-red signal. An infra-red detector can receive the data carried in the infra-red signal and appropriate circuitry can place the data on bus 2202. Bus 2202 carries the data to main memory 2206, from which processor 2204 retrieves and executes the instructions. The instructions received by main memory 2206 may optionally be stored on storage device 2210 either before or after execution by processor 2204.

Computer system 2200 also includes a communication interface 2218 coupled to bus 2202. Communication interface 2218 provides a two-way data communication coupling to a network link 2220 that is connected to a local network 2222. For example, communication interface 2218 may be an integrated services digital network (ISDN) card or a modem to provide a data communication connection to a corresponding type of telephone line. As another example, communication interface 2218 may be a local area network (LAN) card to provide a data communication connection to a compatible LAN. Wireless links may also be implemented. In any such implementation, communication interface 2218 sends and receives electrical, electromagnetic or optical signals that carry digital data streams representing various types of information.

Network link 2220 typically provides data communication through one or more networks to other data devices. For example, network link 2220 may provide a connection through local network 2222 to a host computer 2224 or to data equipment operated by an Internet Service Provider (ISP) 2226. ISP 2226 in turn provides data communication services through the world wide packet data communication network now commonly referred to as the "Internet" 2228. Local network 2222 and Internet 2228 both use electrical, electromagnetic or optical signals that carry digital data streams. The signals through the various networks and the signals on network link 2220 and through communication interface 2218, which carry the digital data to and from computer system 2200, are exemplary forms of carrier waves transporting the information.

Computer system 2200 can send messages and receive data, including program code, through the network(s), network link 2220 and communication interface 2218. In the Internet example, a server 2230 might transmit a requested code for an application program through Internet 2228, ISP 2226, local network 2222 and communication interface 2218. The received code may be executed by processor 2204 as it is received, and/or stored in storage device 2210, or other non-volatile storage for later execution. In this manner, computer system 2200 may obtain application code in the form of a carrier wave.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the appended claims.

What is claimed is:

1. A method for abstracting a precharged latch, comprising:

accessing a logic level representation of a structure, said logic level representation comprising a data node, and a clock node for receiving a clock signal, said clock signal having multiple phases;

deriving a first resultant cofactor based upon said logic level representation and a first phase of said clock signal;

determining whether said first resultant cofactor indicates: (1) a first node of said logic level representation experiencing a precharge; and (2) a second node of said logic level representation maintaining a previous logic value;

in response to an affirmative determination, concluding that said second node is a precharged latch candidate;

deriving a second resultant cofactor based upon said logic level representation and a second phase of said clock signal;

determining whether said second resultant cofactor is devoid of a feedback loop; and in response to an affirmative determination, abstracting said structure as a precharged latch.

2. The method of claim 1, wherein deriving said first resultant cofactor comprises:

performing cofactor computation on said logic level representation while restricting said clock signal to a particular logic value.

3. The method of claim 2, wherein deriving said second resultant cofactor comprises:

performing cofactor computation on said logic level representation while restricting said clock signal to another logic value which is different from said particular logic value.

4. The method of claim 2, wherein said logic level representation further comprises a charge storage delay coupled to said first node, and wherein deriving said second resultant cofactor comprises:

propagating said precharge experienced by said first node through said charge storage delay; and thereafter performing cofactor computation on said logic level representation while restricting said clock signal to another logic value which is different from said particular logic value.

5. The method of claim 1, wherein determining whether said first resultant cofactor indicates that said second node is maintaining a previous logic value comprises:

determining whether said second node is part of a feedback loop.

6. The method of claim 1, wherein said logic level representation further comprises a feedback loop delay, and wherein determining whether said first resultant cofactor indicates that said second node is maintaining a previous logic value comprises:

determining whether said second node is coupled to said feedback loop delay.

7. The method of claim 1, further comprising:

in response to a determination that said first resultant cofactor indicates either: (1) that said first node of said logic level representation does not experience a precharge; or (2) that said second node of said logic level representation does not maintain a previous logic value, concluding that said structure is not a precharged latch.

8. The method of claim 1, further comprising:

in response to a determination that said second resultant cofactor is not devoid of a feedback loop, concluding that said structure is not a precharged latch.

9. A computer readable medium, comprising:

instructions for causing one or more processors to access a logic level representation of a structure, said logic level representation comprising a data node, and a clock node for receiving a clock signal, said clock signal having multiple phases;

instructions for causing one or more processors to derive a first resultant cofactor based upon said logic level representation and a first phase of said clock signal;

instructions for causing one or more processors to determine whether said first resultant cofactor indicates: (1) a first node of said logic level representation experiencing a precharge; and (2) a second node of said logic level representation maintaining a previous logic value;

instructions for causing one or more processors to conclude, in response to an affirmative determination, that said second node is a precharged latch candidate;

instructions for causing one or more processors to derive a second resultant cofactor based upon said logic level representation and a second phase of said clock signal;

instructions for causing one or more processors to determine whether said second resultant cofactor is devoid of a feedback loop; and instructions for causing one or more processors to abstract, in response to an affirmative determination, said structure as a precharged latch.

10. The computer readable medium of claim 9, wherein the instructions for causing one or more processors to derive said first resultant cofactor comprises:

instructions for causing one or more processors to perform cofactor computation on said logic level representation while restricting said clock signal to a particular logic value.

11. The computer readable medium of claim 10, wherein the instructions for causing one or more processors to derive said second resultant cofactor comprises:

instructions for causing one or more processors to perform cofactor computation on said logic level representation while restricting said clock signal to another logic value which is different from said particular logic value.

12. The computer readable medium of claim 10, wherein said logic level representation further comprises a charge storage delay coupled to said first node, and wherein the instructions for causing one or more processors to derive said second resultant cofactor comprises:

instructions for causing one or more processors to propagate said precharge experienced by said first node through said charge storage delay; and instructions for causing one or more processors to thereafter perform cofactor computation on said logic level representation while restricting said clock signal to another logic value which is different from said particular logic value.

13. The computer readable medium of claim 9, wherein the instructions for causing one or more processors to determine whether said first resultant cofactor indicates that said second node is maintaining a previous logic value comprises:

instructions for causing one or more processors to determine whether said second node is part of a feedback loop.

14. The computer readable medium of claim 9, wherein said logic level representation further comprises a feedback loop delay, and wherein the instructions for causing one or more processors to determine whether said first resultant cofactor indicates that said second node is maintaining a previous logic value comprises:

instructions for causing one or more processors to determine whether said second node is coupled to said feedback loop delay.

15. The computer readable medium of claim 9, further comprising:

instructions for causing one or more processors to conclude, in response to a determination that said first resultant cofactor indicates either: (1) that said first node of said logic level representation does not experience a precharge; or (2) that said second node of said logic level representation does not maintain a previous logic value, that said structure is not a precharged latch.

16. The computer readable medium of claim 9, further comprising:

instructions for causing one or more processors to conclude, in response to a determination that said second resultant cofactor is not devoid of a feedback loop, that said structure is not a precharged latch.

17. An apparatus for abstracting a precharged latch, comprising:

a mechanism for accessing a logic level representation of a structure, said logic level representation comprising a data node, and a clock node for receiving a clock signal, said clock signal having multiple phases;

a mechanism for deriving a first resultant cofactor based upon said logic level representation and a first phase of said clock signal;

a mechanism for determining whether said first resultant cofactor indicates: (1) a first node of said logic level representation experiencing a precharge; and (2) a second node of said logic level representation maintaining a previous logic value;

a mechanism for concluding, in response to an affirmative determination, that said second node is a precharged latch candidate;

a mechanism for deriving a second resultant cofactor based upon said logic level representation and a second phase of said clock signal;

a mechanism for determining whether said second resultant cofactor is devoid of a feedback loop; and a mechanism for abstracting, in response to an affirmative determination, said structure as a precharged latch.

18. The apparatus of claim 17, wherein the mechanism for deriving said first resultant cofactor comprises:

a mechanism for performing cofactor computation on said logic level representation while restricting said clock signal to a particular logic value.

19. The apparatus of claim 18, wherein the mechanism for deriving said second resultant cofactor comprises:

a mechanism for performing cofactor computation on said logic level representation while restricting said clock signal to another logic value which is different from said particular logic value.

20. The apparatus of claim 18, wherein said logic level representation further comprises a charge storage delay coupled to said first node, and wherein the mechanism for deriving said second resultant cofactor comprises:

a mechanism for propagating said precharge experienced by said first node through said charge storage delay; and a mechanism for thereafter performing cofactor computation on said logic level representation while restricting said clock signal to another logic value which is different from said particular logic value.

21. The apparatus of claim 17, wherein the mechanism for determining whether said first resultant cofactor indicates that said second node is maintaining a previous logic value comprises:

a mechanism for determining whether said second node is part of a feedback loop.

22. The apparatus of claim 17, wherein said logic level representation further comprises a feedback loop delay, and wherein the mechanism for determining whether said first resultant cofactor indicates that said second node is maintaining a previous logic value comprises:

a mechanism for determining whether said second node is coupled to said feedback loop delay.

23. The apparatus of claim 17, further comprising:

a mechanism for concluding, in response to a determination that said first resultant cofactor indicates either: (1) that said first node of said logic level representation does not experience a precharge; or (2) that said second node of said logic level representation does not maintain a previous logic value, that said structure is not a precharged latch.

24. The apparatus of claim 17, further comprising:
a mechanism for concluding, in response to a determination that said second resultant cofactor is not devoid of a feedback loop, that said structure is not a precharged latch.

25. A method for abstracting a precharged flip-flop, comprising:
accessing a logic level representation of a structure, said logic level representation comprising a data node, and a clock node for receiving a clock signal, said clock signal having multiple phases;
deriving a first resultant cofactor based upon said logic level representation and a first phase of said clock signal;
determining whether said first resultant cofactor indicates: (1) a first node of said logic level representation experiencing a first precharge; (2) a second node of said logic level representation experiencing a second precharge; and (3) a third node of said logic level representation maintaining a previous logic value;
in response to an affirmative determination, concluding that said third node is a precharged flip-flop candidate;
deriving a second resultant cofactor based upon said logic level representation and a second phase of said clock signal;
determining whether said second resultant cofactor is devoid of a feedback loop;
in response to an affirmative determination, concluding that said third node is still a precharged flip-flop candidate;
determining, based upon said logic level representation, said second phase of said clock signal, and an assumption that said first and second nodes have complementary logic values, whether logic values taken on by said third node are independent of logic values taken on by said data node; and
in response to an affirmative determination, abstracting said structure as a precharged flip-flop.

26. The method of claim 25, wherein deriving said first resultant cofactor comprises:
performing cofactor computation on said logic level representation while restricting said clock signal to a particular logic value.

27. The method of claim 26, wherein deriving said second resultant cofactor comprises:
performing cofactor computation on said logic level representation while restricting said clock signal to another logic value which is different from said particular logic value.

28. The method of claim 26, wherein said logic level representation further comprises a first delay coupled to said first node, and a second delay coupled to said second node, and wherein deriving said second resultant cofactor comprises:
propagating said first precharge through said first delay, and said second precharge through said second delay; and
thereafter performing cofactor computation on said logic level representation while restricting said clock signal to another logic value which is different from said particular logic value.

29. The method of claim 28, wherein determining whether logic values taken on by said third node are independent of logic values taken on by said data node comprises:
propagating a logic 1 value from said first node through said first delay, and a logic 0 value from said second node through said second delay; and
thereafter performing cofactor computation on said logic level representation while restricting said clock signal to said another logic value to derive a third resultant cofactor.

30. The method of claim 29, wherein determining whether logic values taken on by said third node are independent of logic values taken on by said data node further comprises:
propagating a logic 0 value from said first node through said first delay, and a logic 1 value from said second node through said second delay; and
thereafter performing cofactor computation on said logic level representation while restricting said clock signal to said another logic value to derive a fourth resultant cofactor.

31. The method of claim 30, wherein determining whether logic values taken on by said third node are independent of logic values taken on by said data node further comprises:
determining whether said third and fourth resultant cofactors indicate that logic values taken on by said third node are independent of logic values taken on by said data node.

32. The method of claim 25, wherein determining whether said first resultant cofactor indicates that said third node is maintaining a previous logic value comprises:
determining whether said third node is part of a feedback loop.

33. The method of claim 25, wherein said logic level representation further comprises a feedback loop delay, and wherein determining whether said first resultant cofactor indicates that said third node is maintaining a previous logic value comprises:
determining whether said third node is coupled to said feedback loop delay.

34. The method of claim 25, further comprising:
in response to a determination that said first resultant cofactor indicates either: (1) that said first node of said logic level representation does not experience said first precharge; or (2) that said second node of said logic level representation does not experience said second precharge; or (3) that said third node of said logic level representation does not maintain a previous logic value, concluding that said structure is not a precharged flip-flop.

35. The method of claim 25, further comprising:
in response to a determination that said second resultant cofactor is not devoid of a feedback loop, concluding that said structure is not a precharged flip-flop.

36. The method of claim 25, further comprising:
in response to a determination that logic values taken on by said third node are not independent of logic values taken on by said data node when an assumption that said first and second nodes have complementary logic values is made, concluding that said structure is not a precharged flip-flop.

37. A computer readable medium, comprising:
instructions for causing one or more processors to access a logic level representation of a structure, said logic level representation comprising a data node, and a clock node for receiving a clock signal, said clock signal having multiple phases;

instructions for causing one or more processors to derive a first resultant cofactor based upon said logic level representation and a first phase of said clock signal;

instructions for causing one or more processors to determine whether said first resultant cofactor indicates: (1) a first node of said logic level representation experiencing a first precharge; (2) a second node of said logic level representation experiencing a second precharge; and (3) a third node of said logic level representation maintaining a previous logic value;

instructions for causing one or more processors to conclude, in response to an affirmative determination, that said third node is a precharged flip-flop candidate;

instructions for causing one or more processors to derive a second resultant cofactor based upon said logic level representation and a second phase of said clock signal;

instructions for causing one or more processors to determine whether said second resultant cofactor is devoid of a feedback loop;

instructions for causing one or more processors to conclude, in response to an affirmative determination, that said third node is still a precharged flip-flop candidate;

instructions for causing one or more processors to determine, base d upon said logic level representation, said second phase of said clock signal, and an assumption that said first and second nodes have complementary logic values, whether logic values taken on by said third node are independent of logic values taken on by said data node; and instructions for causing one or more processors to abstract, in response to an affirmative determination, said structure as a precharged flip-flop.

38. The computer readable medium of claim 37, wherein the instructions for causing one or more processors to derive said first resultant cofactor comprises:

instructions for causing one or more processors to perform cofactor computation on said logic level representation while restricting said clock signal to a particular logic value.

39. The computer readable medium of claim 38, wherein the instructions for causing one or more processors to derive said second resultant cofactor comprises:

instructions for causing one or more processors to perform cofactor computation on said logic level representation while restricting said clock signal to another logic value which is different from said particular logic value.

40. The computer readable medium of claim 38, wherein said logic level representation further comprises a first delay coupled to said first node, and a second delay coupled to said second node, and wherein the instructions for causing one or more processors to derive said second resultant cofactor comprises:

instructions for causing one or more processors to propagate said first precharge through said first delay, and said second precharge through said second delay; and instructions for causing one or more processors to thereafter perform cofactor computation on said logic level representation while restricting said clock signal to another logic value which is different from said particular logic value.

41. The computer readable medium of claim 40, wherein the instructions for causing one or more processors to determine whether logic values taken on by said third node are independent of logic values taken on by said data node comprises:

instructions for causing one or more processors to propagate a logic 1 value from said first node through said first delay, and a logic 0 value from said second node through said second delay; and instructions for causing one or more processors to thereafter perform cofactor computation on said logic level representation while restricting said clock signal to said another logic value to derive a third resultant cofactor.

42. The computer readable medium of claim 41, wherein the instructions for causing one or more processors to determine whether logic values taken on by said third node are independent of logic values taken on by said data node further comprises:

instructions for causing one or more processors to propagate a logic 0 value from said first node through said first delay, and a logic 1 value from said second node through said second delay; and instructions for causing one or more processors to thereafter perform cofactor computation on said logic level representation while restricting said clock signal to said another logic value to derive a fourth resultant cofactor.

43. The computer readable medium of claim 42, wherein the instructions for causing one or more processors to determine whether logic values taken on by said third node are independent of logic values taken on by said data node further comprises:

instructions for causing one or more processors to determine whether said third and fourth resultant cofactors indicate that logic values taken on by said third node are independent of logic values taken on by said data node.

44. The computer readable medium of claim 37, wherein the instructions for causing one or more processors to determine whether said first resultant cofactor indicates that said third node is maintaining a previous logic value comprises:

instructions for causing one or more processors to determine whether said third node is part of a feedback loop.

45. The computer readable medium of claim 37, wherein said logic level representation further comprises a feedback loop delay, and wherein the instructions for causing one or more processors to determine whether said first resultant cofactor indicates that said third node is maintaining a previous logic value comprises:

instructions for causing one or more processors to determine whether said third node is coupled to said feedback loop delay.

46. The computer readable medium of claim 37, further comprising:

instructions for causing one or more processors to conclude, in response to a determination that said first resultant cofactor indicates either: (1) that said first node of said logic level representation does not experience said first precharge; or (2) that said second node of said logic level representation does not experience said second precharge; or (3) that said third node of said logic level representation does not maintain a previous logic value, that said structure is not a precharged flip-flop.

47. The computer readable medium of claim 37, further comprising:

instructions for causing one or more processors to conclude, in response to a determination that said second resultant cofactor is not devoid of a feedback loop, that said structure is not a precharged flip-flop.

48. The computer readable medium of claim 37, further comprising:

instructions for causing one or more processors to conclude, in response to a determination that logic values taken on by said third node are not independent of logic values taken on by said data node when an assumption that said first and second nodes have complementary logic values is made, that said structure is not a precharged flip-flop.

49. An apparatus for abstracting a precharged flip-flop, comprising:

a mechanism for accessing a logic level representation of a structure, said logic level representation comprising a data node, and a clock node for receiving a clock signal, said clock signal having multiple phases;

a mechanism for deriving a first resultant cofactor based upon said logic level representation and a first phase of said clock signal;

a mechanism for determining whether said first resultant cofactor indicates: (1) a first node of said logic level representation experiencing a first precharge; (2) a second node of said logic level representation experiencing a second precharge; and (3) a third node of said logic level representation maintaining a previous logic value;

a mechanism for concluding, in response to an affirmative determination, that said third node is a precharged flip-flop candidate;

a mechanism for deriving a second resultant cofactor based upon said logic level representation and a second phase of said clock signal;

a mechanism for determining whether said second resultant cofactor is devoid of a feedback loop;

a mechanism for concluding, in response to an affirmative determination, that said third node is still a precharged flip-flop candidate;

a mechanism for determining, based upon said logic level representation, said second phase of said clock signal, and an assumption that said first and second nodes have complementary logic values, whether logic values taken on by said third node are independent of logic values taken on by said data node; and a mechanism for abstracting, in response to an affirmative determination, said structure as a precharged flip-flop.

50. The apparatus of claim 49, wherein the mechanism for deriving said first resultant cofactor comprises:

a mechanism for performing cofactor computation on said logic level representation while restricting said clock signal to a particular logic value.

51. The apparatus of claim 50, wherein the mechanism for deriving said second resultant cofactor comprises:

a mechanism for performing cofactor computation on said logic level representation while restricting said clock signal to another logic value which is different from said particular logic value.

52. The apparatus of claim 50, wherein said logic level representation further comprises a first delay coupled to said first node, and a second delay coupled to said second node, and wherein the mechanism for deriving said second resultant cofactor comprises:

a mechanism for propagating said first precharge through said first delay, and said second precharge through said second delay; and a mechanism for thereafter performing cofactor computation on said logic level representation while restricting said clock signal to another logic value which is different from said particular logic value.

53. The apparatus of claim 52, wherein the mechanism for determining whether logic values taken on by said third node are independent of logic values taken on by said data node comprises:

a mechanism for propagating a logic 1 value from said first node through said first delay, and a logic 0 value from said second node through said second delay; and a mechanism for thereafter performing cofactor computation on said logic level representation while restricting said clock signal to said another logic value to derive a third resultant cofactor.

54. The apparatus of claim 53, wherein the mechanism for determining whether logic values taken on by said third node are independent of logic values taken on by said data node further comprises:

a mechanism for propagating a logic 0 value from said first node through said first delay, and a logic 1 value from said second node through said second delay; and a mechanism for thereafter performing cofactor computation on said logic level representation while restricting said clock signal to said another logic value to derive a fourth resultant cofactor.

55. The apparatus of claim 54, wherein the mechanism for determining whether logic values taken on by said third node are independent of logic values taken on by said data node further comprises:

a mechanism for determining whether said third and fourth resultant cofactors indicate that logic values taken on by said third node are independent of logic values taken on by said data node.

56. The apparatus of claim 49, wherein the mechanism for determining whether said first resultant cofactor indicates that said third node is maintaining a previous logic value comprises:

a mechanism for determining whether said third node is part of a feedback loop.

57. The apparatus of claim 49, wherein said logic level representation further comprises a feedback loop delay, and wherein the mechanism for determining whether said first resultant cofactor indicates that said third node is maintaining a previous logic value comprises:

a mechanism for determining whether said third node is coupled to said feedback loop delay.

58. The apparatus of claim 49, further comprising:

a mechanism for concluding, in response to a determination that said first resultant cofactor indicates either: (1) that said first node of said logic level representation does not experience said first precharge; or (2) that said second node of said logic level representation does not experience said second precharge; or (3) that said third node of said logic level representation does not maintain a previous logic value, that said structure is not a precharged flip-flop.

59. The apparatus of claim 49, further comprising:

a mechanism for concluding, in response to a determination that said second resultant cofactor is not devoid of a feedback loop, that said structure is not a precharged flip-flop.

60. The apparatus of claim 49, further comprising:

a mechanism for concluding, in response to a determination that logic values taken on by said third node are not independent of logic values taken on by said data node when an assumption that said first and second nodes have complementary logic values is made, that said structure is not a precharged flip-flop.

* * * * *